(12) United States Patent
Chen et al.

(10) Patent No.: US 9,219,007 B2
(45) Date of Patent: Dec. 22, 2015

(54) DOUBLE SELF ALIGNED VIA PATTERNING

(71) Applicants: International Business Machines Corporation, Armonk, NY (US); GLOBALFOUNDRIES INC., Grand Cayman (KY)

(72) Inventors: Hsueh-Chung Chen, Cohoes, NY (US); Yongan Xu, Albany, NY (US); Yunpeng Yin, Niskayuna, NY (US); Ailian Zhao, Slinglerlands, NY (US)

(73) Assignees: International Business Machines Corporation, Armonk, NY (US); Global Foundries Inc., Grand Cayman (KY)

( * ) Notice: Subject to any disclaimer, the term of this patent is extended or adjusted under 35 U.S.C. 154(b) by 136 days.

(21) Appl. No.: 13/913,823

(22) Filed: Jun. 10, 2013

(65) Prior Publication Data
US 2014/0363969 A1 Dec. 11, 2014

(51) Int. Cl.
*H01L 21/768* (2006.01)
*H01L 21/033* (2006.01)
*H01L 21/311* (2006.01)

(52) U.S. Cl.
CPC ...... *H01L 21/76816* (2013.01); *H01L 21/0337* (2013.01); *H01L 21/0338* (2013.01); *H01L 21/31144* (2013.01); *H01L 21/76811* (2013.01)

(58) Field of Classification Search
CPC ................................................ H01L 21/76897
See application file for complete search history.

(56) References Cited

U.S. PATENT DOCUMENTS

| | | | |
|---|---|---|---|
| 7,759,253 B2 | 7/2010 | Chang | |
| 7,781,154 B2 | 8/2010 | Parikh | |
| 7,902,066 B2 | 3/2011 | Ye et al. | |
| 8,043,794 B2 | 10/2011 | Noelscher et al. | |
| 8,207,576 B2 | 6/2012 | Tran et al. | |
| 8,222,151 B2 | 7/2012 | Liang et al. | |
| 8,222,152 B2 | 7/2012 | Sun | |
| 8,298,943 B1 | 10/2012 | Arnold et al. | |
| 8,853,085 B1 | 10/2014 | Abdallah et al. | |
| 2009/0117495 A1 | 5/2009 | Jeong | |
| 2010/0136781 A1 | 6/2010 | Kulkarni et al. | |
| 2011/0159693 A1* | 6/2011 | Sun ................................ | 438/703 |

FOREIGN PATENT DOCUMENTS

| | | |
|---|---|---|
| JP | 2011071383 | 4/2011 |
| JP | 2012074566 | 4/2012 |

* cited by examiner

*Primary Examiner* — Alexander Ghyka
(74) *Attorney, Agent, or Firm* — Steven J Meyers; Hoffman Warnick LLC

(57) ABSTRACT

A method including forming a penta-layer hardmask above a substrate, the penta-layer hardmask comprising a first hardmask layer above a second hardmask layer; forming a trench pattern in the first hardmask layer; transferring a first via bar pattern from a first photo-resist layer above the penta-layer hardmask into the second hardmask layer resulting in a first via pattern, the first via pattern in the second hardmask layer overlapping the trench pattern and being self-aligned on two sides by the trench pattern in the first hardmask layer; and transferring the first via pattern from the second hardmask layer into the substrate resulting in a self-aligned via opening, the self-aligned via opening being self-aligned on all sides by the first via pattern in the second hardmask layer.

14 Claims, 26 Drawing Sheets

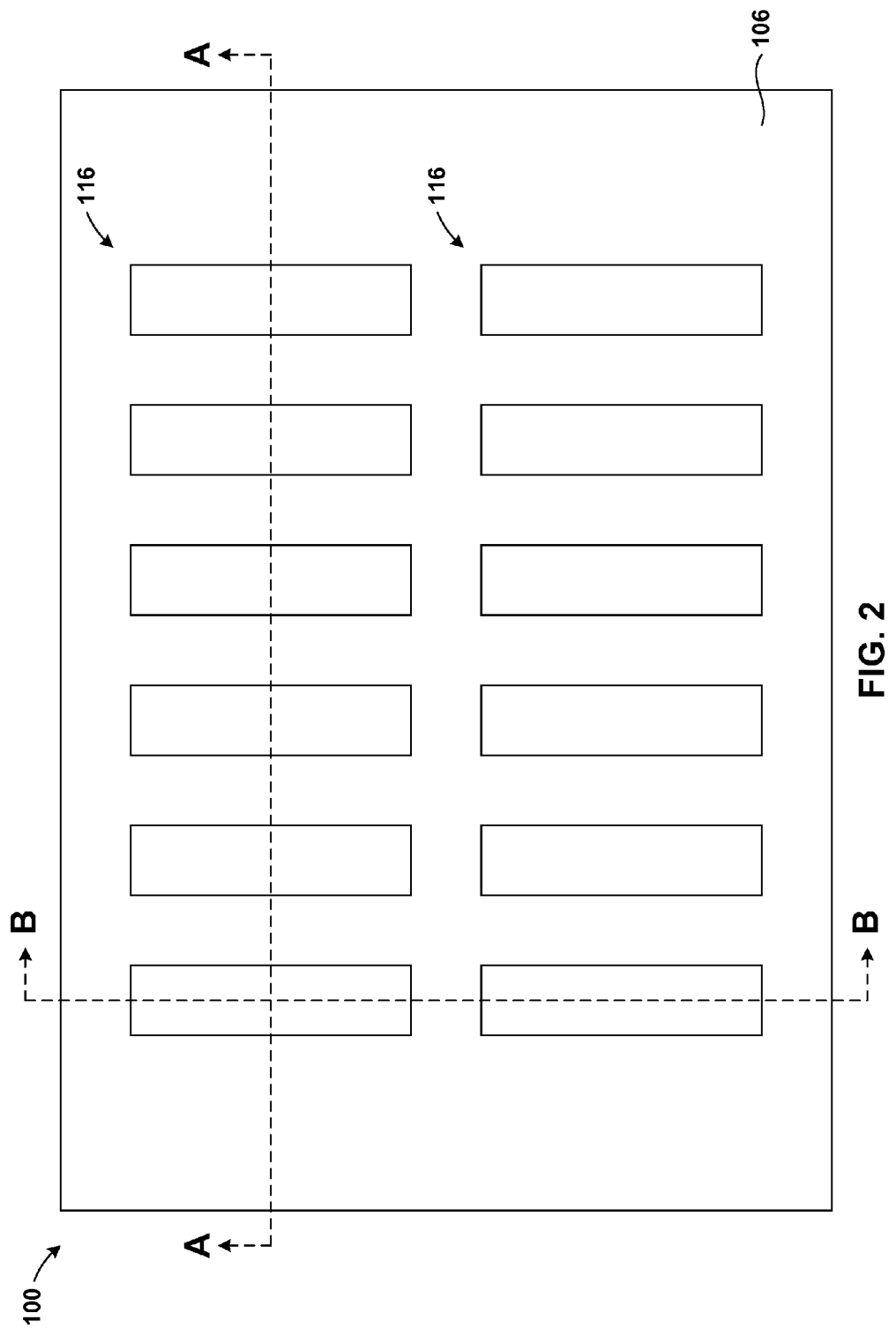

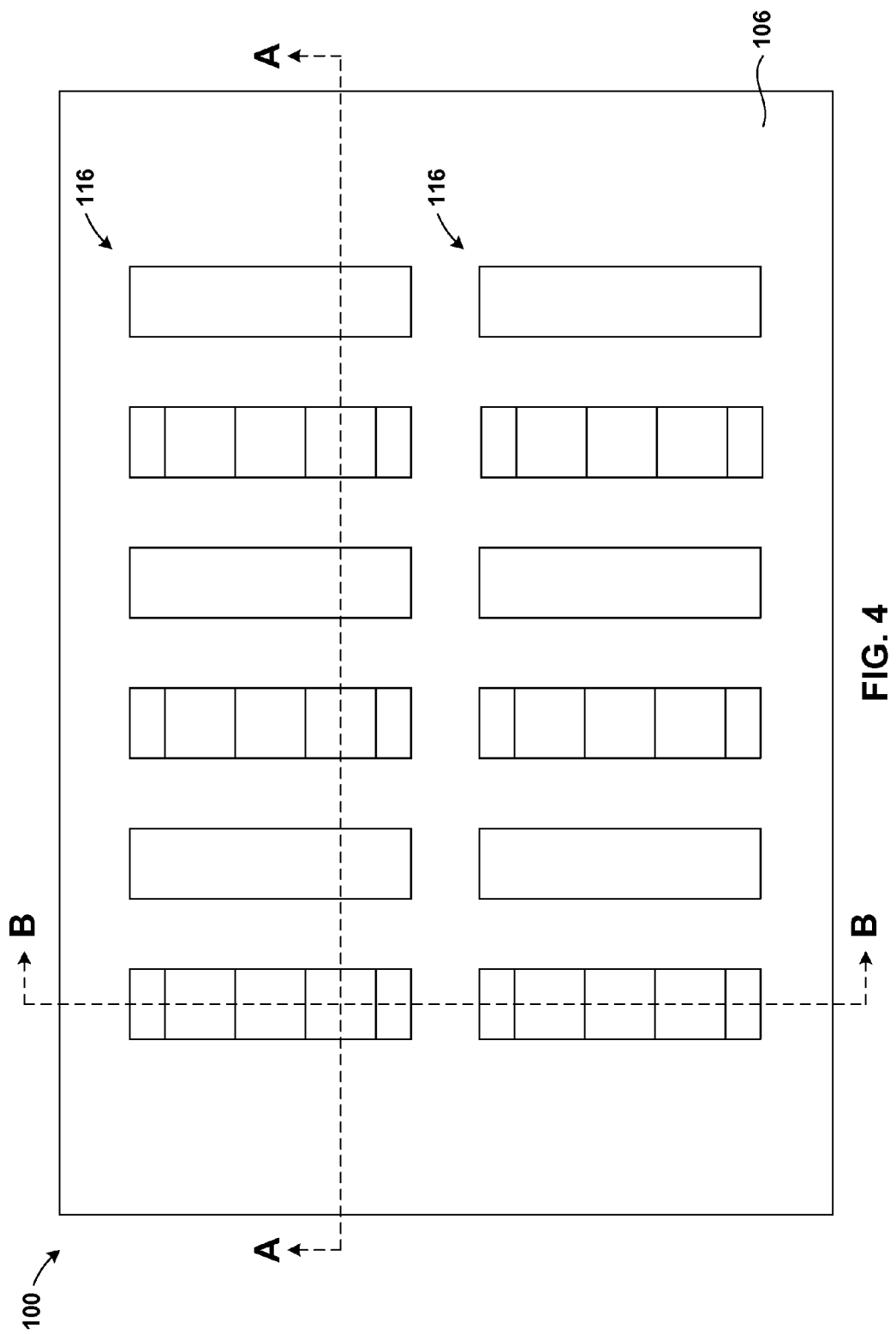

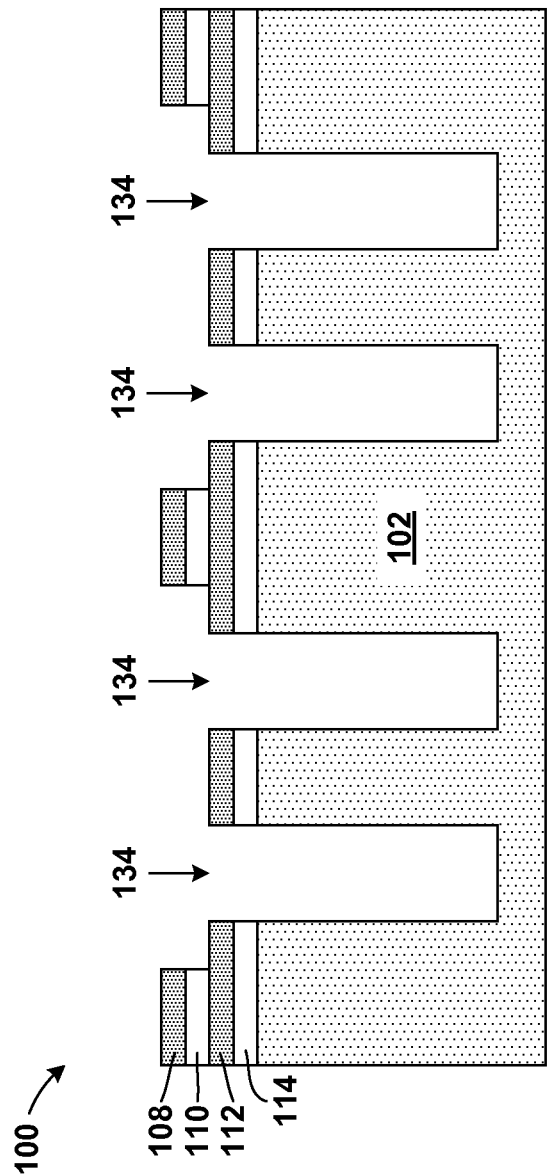

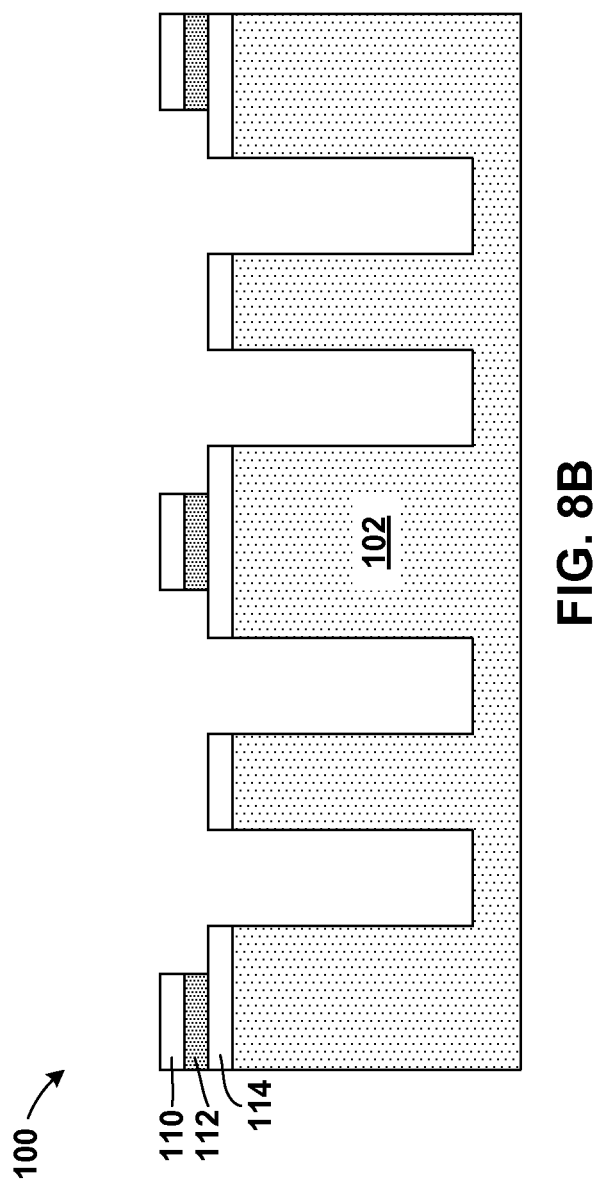

DOUBLE SELF ALIGNED VIA PATTERNING

BACKGROUND

1. Field of the Invention

The present invention generally relates to semiconductor device manufacturing, and more particularly to an improved technique for etching self-aligned via holes and wiring paths into a dielectric layer wherein the via holes self-align to the wiring paths.

2. Background of Invention

Semiconductor device manufacturing generally includes various steps including a patterning process. For example, the manufacturing of a semiconductor chip may start with, for example, CAD (computer aided design) generated device patterns and may continue with the effort to replicate these device patterns in a substrate in which semiconductor devices can be formed. The replication process may involve the use of a photolithography process in which a layer of photo-resist material may be first applied on top of a substrate, and then be selectively exposed according to a pre-determined device pattern. Portions of the photo-resist that are exposed to light or other ionizing radiation (e.g., ultraviolet, electron beams, X-rays, etc.) may experience some changes in their solubility to a certain solution. Next, the photo-resist may be developed in a developer solution, thereby removing the non-irradiated (in a negative resist) or irradiated (in a positive resist) portions of the resist layer, to create a photo-resist pattern. The photo-resist pattern may subsequently be copied or transferred to the substrate underneath the photo-resist pattern.

SUMMARY

According to one exemplary embodiment of the present invention, a method is provided. The method may include forming a penta-layer hardmask above a substrate, the penta-layer hardmask comprising a first hardmask layer above a second hardmask layer; forming a trench pattern in the first hardmask layer; transferring a first via bar pattern from a first photo-resist layer above the penta-layer hardmask into the second hardmask layer resulting in a first via pattern, the first via pattern in the second hardmask layer overlapping the trench pattern and being self-aligned on two sides by the trench pattern in the first hardmask layer; and transferring the first via pattern from the second hardmask layer into the substrate resulting in a self-aligned via opening, the self-aligned via opening being self-aligned on all sides by the first via pattern in the second hardmask layer.

According to another exemplary embodiment of the present invention, a method is provided. The method may include forming a penta-layer hardmask above a substrate, the penta-layer hardmask comprising a first hardmask layer above a second hardmask layer; forming a trench pattern in the first hardmask layer; and forming a self-aligned via opening in the substrate below the trench pattern, the self-aligned via opening being self-aligned on all sides by a self-aligned via pattern in the second hardmask layer.

According to another exemplary embodiment of the present invention, a method is provided. The method may include forming a penta-layer hardmask above a substrate, the penta-layer hardmask comprising a first hardmask layer above a second hardmask layer; forming a trench pattern in the first hardmask layer; transferring a first via bar pattern from a first photo-resist layer above the penta-layer hardmask into the second hardmask layer resulting in a first via pattern, the first via pattern in the second hardmask layer overlapping the trench pattern and being self-aligned on two sides by the trench pattern in the first hardmask layer; transferring a second via bar pattern from a second photo-resist layer above the penta-layer hardmask into the second hardmask layer resulting in a second via pattern, the second via pattern in the second hardmask layer overlapping the trench pattern and being self-aligned on two sides by the trench pattern in the first hardmask layer; and transferring the first via pattern and the second via pattern from the second hardmask layer into the substrate resulting in a self-aligned via opening, the self-aligned via opening being self-aligned on all sides by the first via pattern in the second hardmask layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 2 is a top view of the structure and illustrates forming a trench pattern in a first hardmask layer according to an exemplary embodiment.

FIG. 4 is a top view of the structure and illustrates forming the first via bar pattern in a second hardmask layer according to an exemplary embodiment.

FIG. 7B is a cross section view of FIG. 7, taken along section line B-B.

FIG. 8B is a cross section view of FIG. 8, taken along section line B-B.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
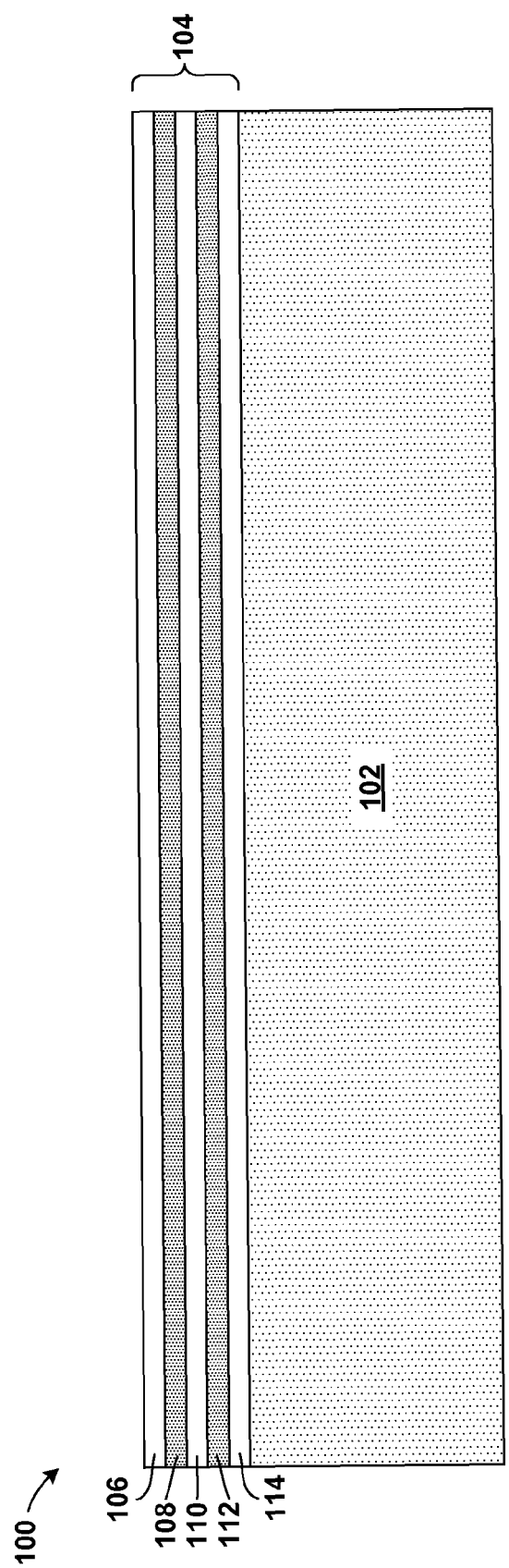
FIG. 1 is a cross-sectional view of a structure at an intermediate step of fabrication according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Engineers are continuously facing the challenge of how to meet the market demand for ever increasing device density. Some techniques used to increase device density may require sub-lithographic (i.e., of a size smaller than can be produced using conventional lithographic processes) mask images, and which may require increased accuracy to prevent unwanted misalignment. As such, it would also be desirable to have a process where vias self-align themselves to their respective metal lines during their creation.

Embodiments of the present invention describe an improved technique for etching via holes and wiring paths into a dielectric layer wherein the via holes self-align to the wiring paths.

A preferred embodiment includes using a trench-first metal hard mask (TFMHM) sequence wherein a first sub-lithographic trench pattern (corresponding to a wiring path) is etched into a first hardmask layer using, for example, a side-wall image transfer technique. This is followed by etching a via opening into a second hardmask layer below the first hardmask layer. The via opening in the second hardmask layer may be formed by patterning a second sub-lithographic trench pattern, otherwise referred to as a via bar pattern, across and perpendicular to the first trench. After etching, the via opening in the second hardmask layer may be formed only where the first trench and the via bar pattern intersect. In the present embodiment, the via opening may be considered self-aligned in a via bar direction by the first trench pattern in the first hardmask layer. Lastly, the via pattern may be transferred from the second hardmask into an underlying substrate. The final via opening in the substrate may also be self-aligned in a first trench direction by the second hardmask layer. It should be noted that the via bar direction can generally refer to a direction along the length of any one of the via bar features, and the first trench direction can generally refer to a direction along the length of any one of the first trench features.

FIG. 1 is a demonstrative illustration of a structure during an intermediate step of a method of double patterning a self-aligned via (SAV) according to one embodiment. More specifically, the method can start with providing a penta-layer hardmask 104 above a substrate 102 in which the SAV is to be formed. The penta-layer hardmask 104 can further include, for example, a first patterning layer 106, a first hardmask layer 108, a second patterning layer 110, a second hardmask layer 112, and a third patterning layer 114 all of which can be formed on top of one another and in sequence.

In one embodiment, the substrate 102 at the bottom of the penta-layer hardmask 104 can be any dielectric materials suitable for BEOL or MOL interconnect structures. In an alternative embodiment the substrate 102 can be any gate materials suitable for FEOL structures. In other embodiments, the substrate 102 can be a semiconductor material or a dielectric material on top of a semiconductor material. The first, second, and third patterning layers 106, 110, 114 can include silicon oxide and can be formed, for example, from a tetraethyl orthosilicate (TEOS) precursor to have a thickness, in some embodiments, ranging from about 10 nanometers (nm) to about 100 nm. The first and second hardmask layers 108, 112 can include titanium-nitride (TiN), titanium anti-reflective coating (TiARC), hafnium anti-reflective coating (hfARC), amorphous carbon (a-C), carbon (a-Si), or NBlock and can have a thickness, in some embodiments, ranging from about 10 nm to about 70 nm. The first and second hardmask layers 108, 112 can preferably, although not necessarily, be formed to have the same or close to the same thickness to facilitate an etching process as described in more detail below.

Figure 2A:
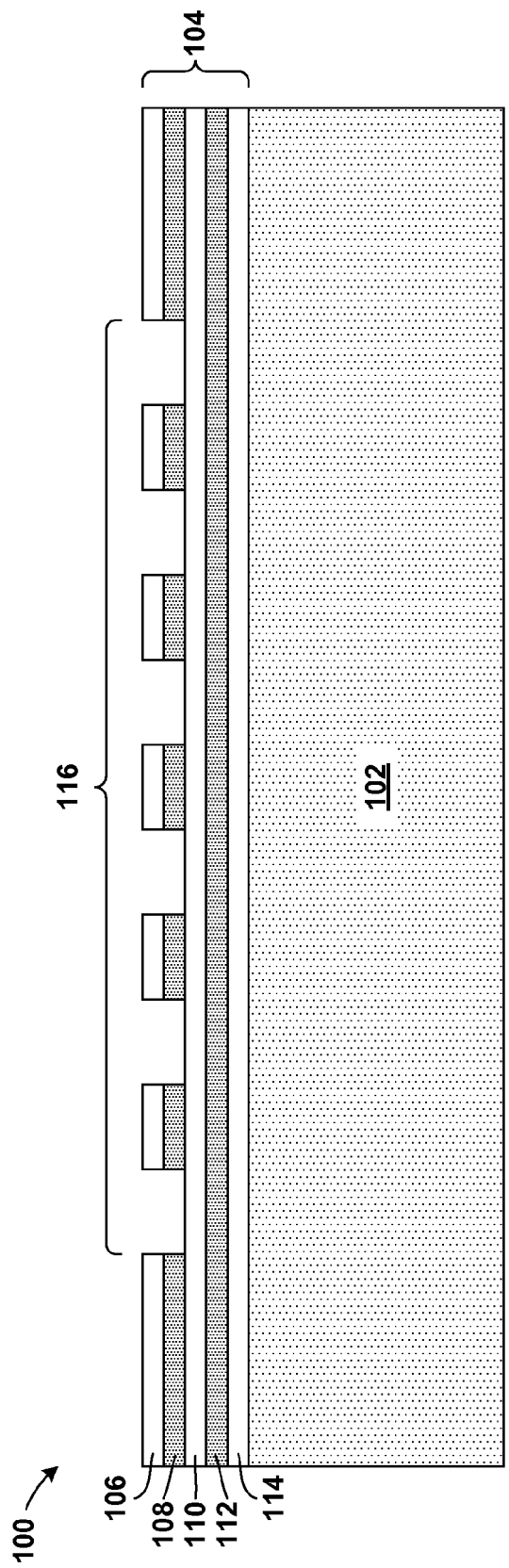
FIG. 2A is a cross section view of FIG. 2, taken along section line A-A.
Figure 2B:
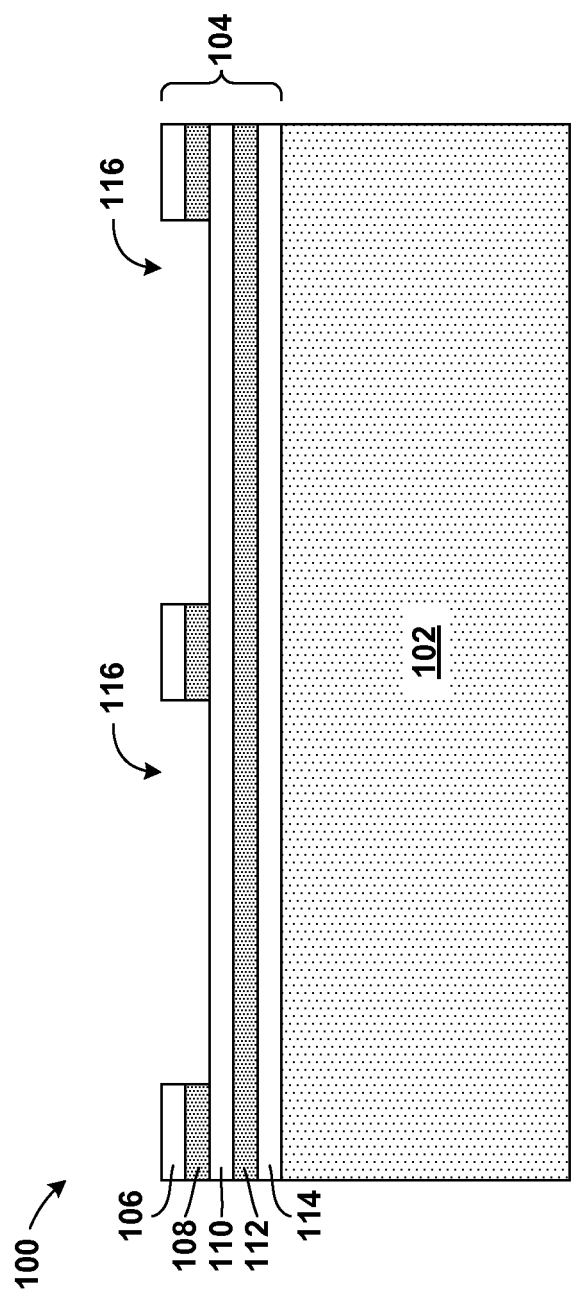
FIG. 2B is a cross section view of FIG. 2, taken along section line B-B.

FIGS. 2, 2A, and 2B are a demonstrative illustration of the structure during an intermediate step of a method of double patterning a self-aligned via (SAV) according to one embodiment. More specifically, the method can start with forming a trench pattern in a penta-layer hardmask 104 above a substrate 102. FIG. 2 illustrates the structure 100 from a top view. FIG. 2A is a cross section view of FIG. 2 taken along section line A-A. FIG. 2B is a cross section view of FIG. 2 taken along section line B-B. Therefore, FIG. 2A is a cross sectional view perpendicular to the length of the trenches of the trench pattern 116, and FIG. 2B is a cross sectional view parallel to the length of the trenches of the trench pattern 116. The trench pattern 116 may be transferred into the first hardmask layer 108 using, for example, known sidewall image transfer techniques. Any other method known in the art can be used to form the trench pattern 116 in the first hardmask layer 108. It should be noted that formation of the trench pattern 116 in the first hardmask layer 108, also includes etching through the first patterning layer 106 as illustrated in the figures.

In one embodiment, the trench pattern 116 can have sub-lithographic dimensions. A sidewall image transfer technique can be used to achieve sub-lithographic features and feature spacing, as is known in the art. The term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed. In another embodiment, double patterning techniques well known in the art may be use to form the trench pattern 116 in the first hardmask layer 106.

The trench pattern 116 may include one or more trench features, as illustrated in the figures. The sub-lithographic dimension of any one trench feature may generally refer to the width and not necessarily the length, the width generally being the smaller dimension of the two. Furthermore, any one trench feature of the trench pattern 116 may have any length suitable for its intended application; however the length is not critical to the present invention.

Figure 3:
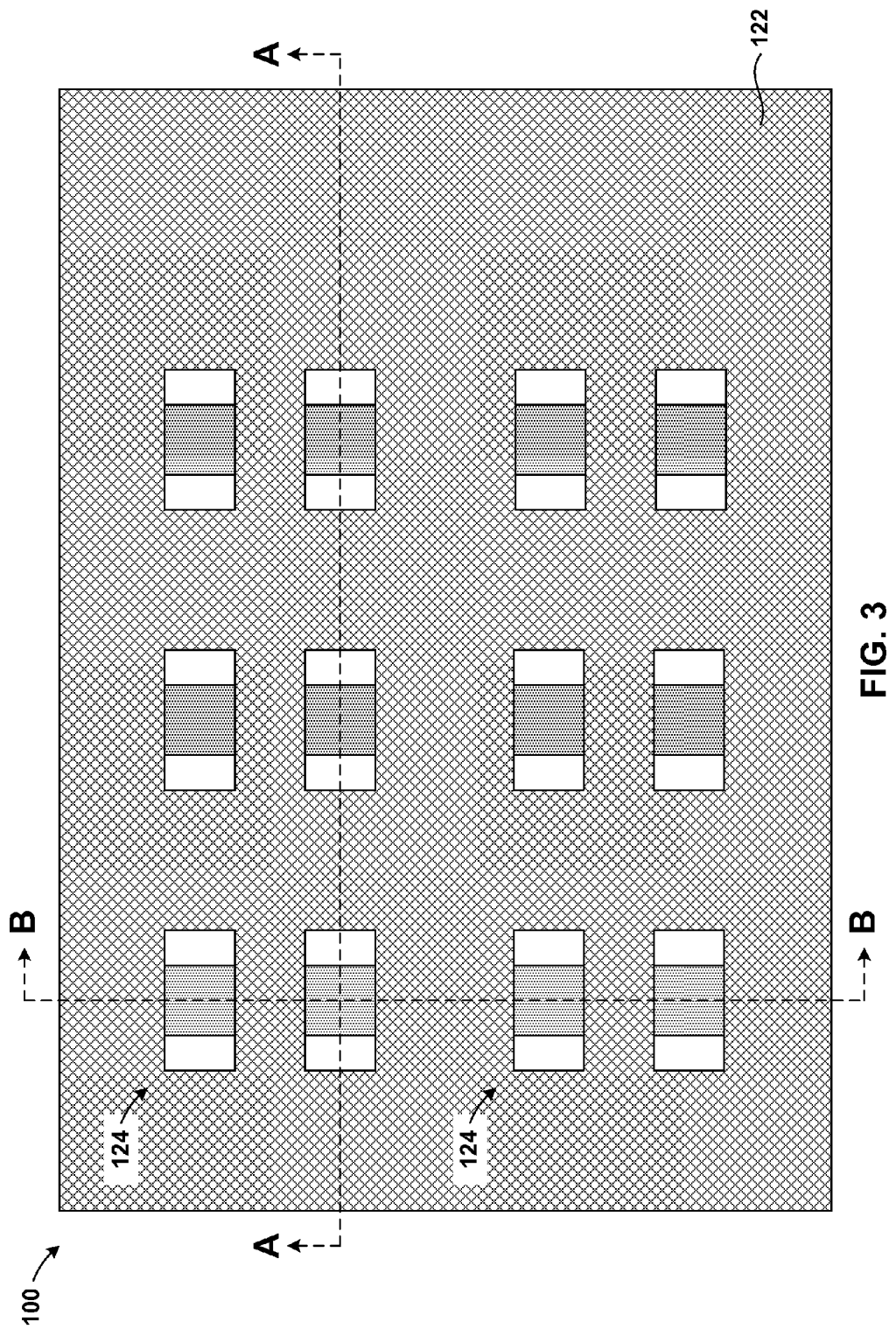
FIG. 3 is a top view of the structure and illustrates forming a first via bar pattern in a first ARC layer, a first planarization layer, and a second pattering layer according to an exemplary embodiment.
Figure 3A:
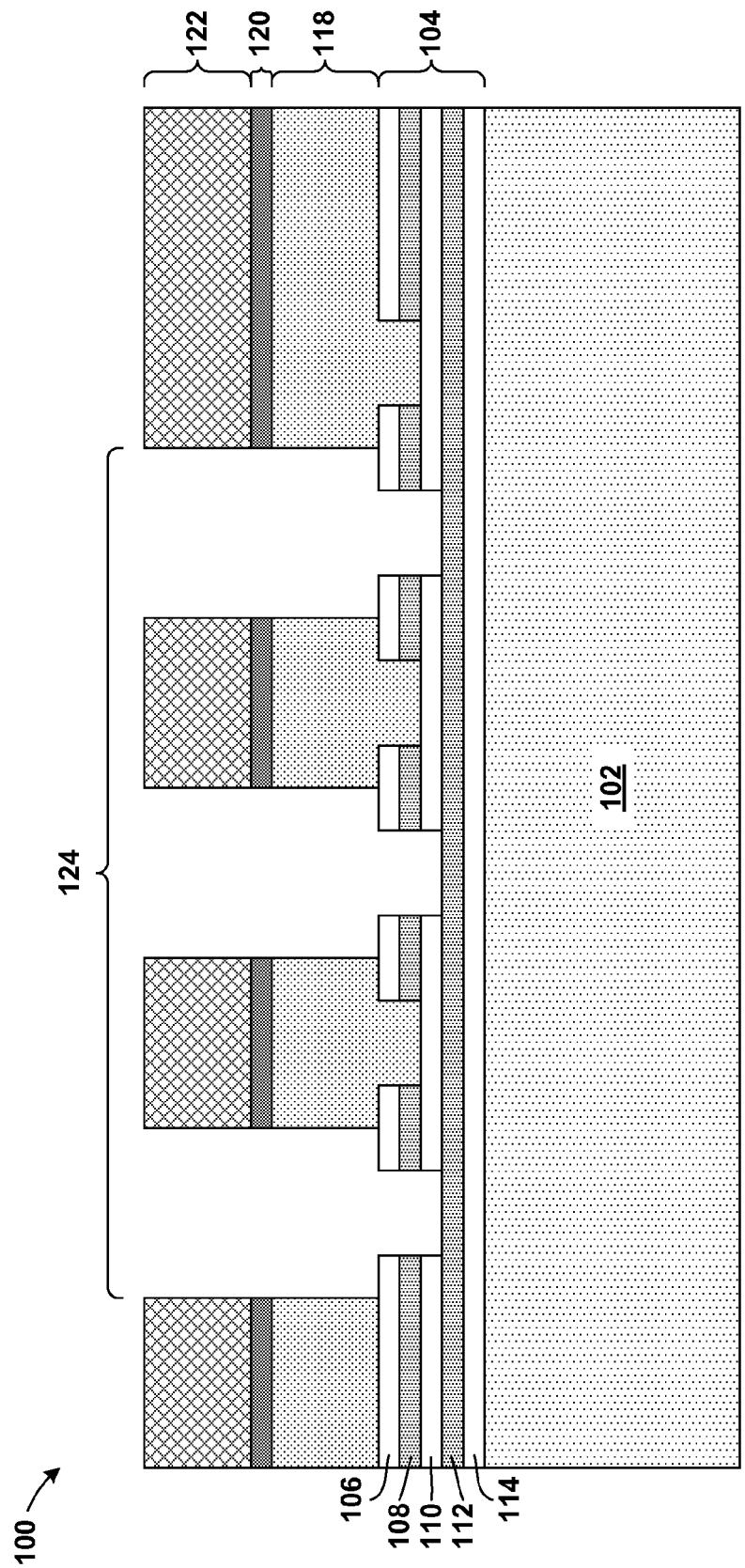
FIG. 3A is a cross section view of FIG. 3, taken along section line A-A.
Figure 3B:
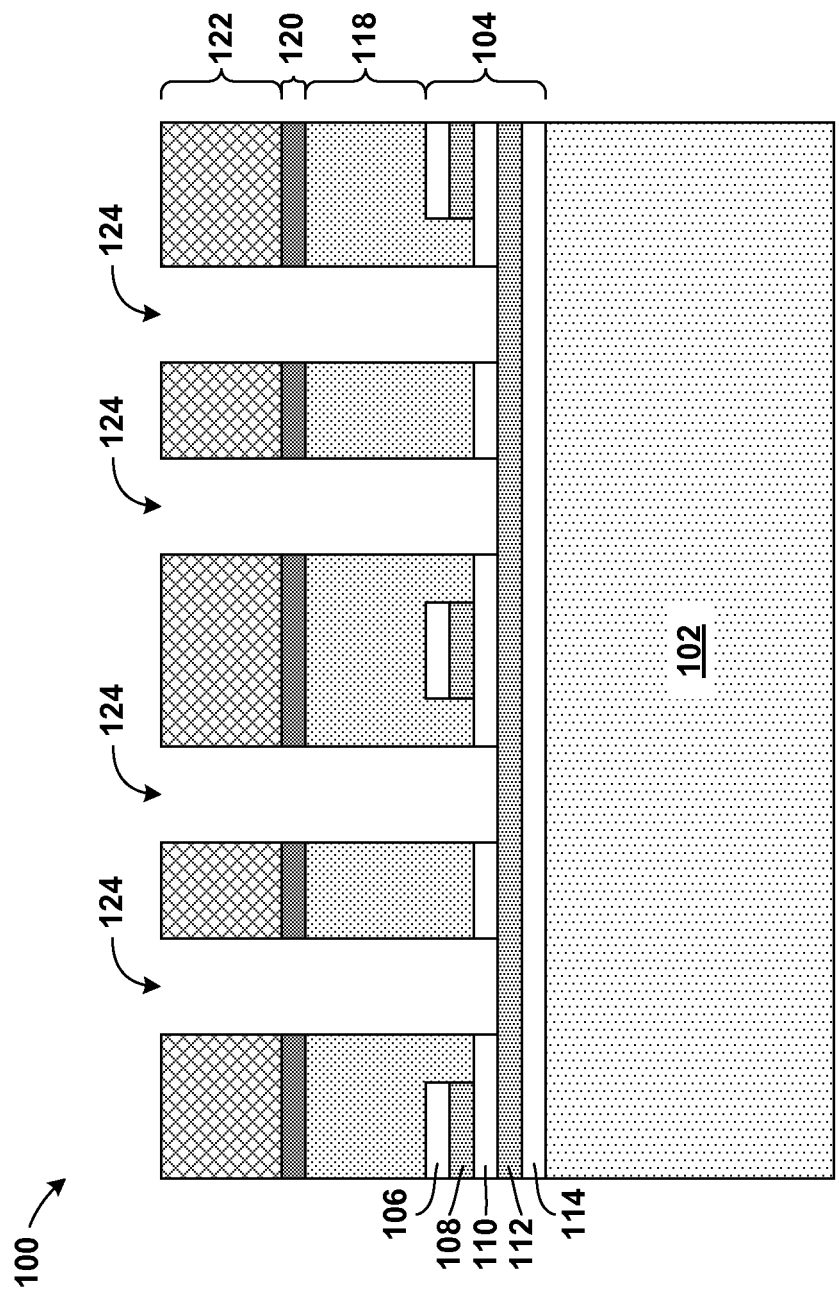
FIG. 3B is a cross section view of FIG. 3, taken along section line B-B.

FIGS. 3, 3A, and 3B are a demonstrative illustration of the structure during an intermediate step of a method of double patterning a self-aligned via (SAV) according to one embodiment. More specifically, the method can include a first stage of a double patterning technique in which a first via bar pattern 124 can be transferred into a first planarization layer 118 and a first anti-reflective coating layer 120 (hereinafter "ARC" layer). FIG. 3 illustrates the structure 100 from a top view. FIG. 3A is a cross section view of FIG. 3 taken along section line A-A. FIG. 3B is a cross section view of FIG. 3 taken along section line B-B.

The first via bar pattern 124 can include one or more via bar features, each of which is oriented above and in a perpendicular fashion relative to any one of the trench features of the trench pattern 116. First, as illustrated in FIGS. 3A and 3B, the first planarization layer 118, the first ARC layer 120, and a first photo-resist layer 122 all of which can be formed on top of one another and in sequence.

The first planarization layer 118 can be an organic planarization layer (OPL) or a layer of material that is capable of being planarized by known chemical mechanical polishing techniques. In one embodiment, for example, the first planarization layer 118 can be an amorphous carbon layer able to withstand the high process temperatures of subsequent processing steps. The first planarization layer 118 can preferably have a thickness ranging from about 10 nm to about 300 nm. The first ARC layer 120 can include silicon (Si) and in some embodiments can be referred to as a SiARC layer or a bottom anti-reflective coating layer (BARC). The first ARC layer 120 can have a thickness ranging from about 10 nm to about 100 nm in some embodiments.

During this step, a first photo-resist layer 122 can be formed on top of the first ARC layer 120. The first photo-resist layer 122 can include any suitable photo-resist material. The particular photo-resist material chosen can partly depend upon the desired pattern to be formed and the exposure method used. In one embodiment, the first photo-resist layer 122 can include a single exposure resist suitable for, for example, argon fluoride (ArF); a double exposure resist suitable for, for example, a thermal cure system; or an extreme ultraviolet (EUV) resist suitable for, for example, an optical process. In one embodiment, the first photo-resist layer 122 can be formed with a thickness ranging from about 30 nm to about 150 nm. The first photo-resist layer 122 can then be lithographically exposed and developed to create the first via bar pattern 124. The first via bar pattern 124 can be formed by applying any appropriate photo-exposure method suitable to the type of photo-resist layer being used, as is well known in the art.

More specifically, the first via bar pattern 124 can be transferred from the first photo-resist layer 122 into underlying layers, for example, the first ARC layer 120 and the first planarization layer 118. Transferring of the first via bar pattern 124 in the present step can be performed by etching the first ARC layer 120 and the first planarization layer 118 selective to the second hardmask layer 112. A directional etching technique such as a reactive-ion-etching technique can be used to etch the first ARC layer 120 and the first planarization layer 118. In one embodiment, the first ARC layer 120 can be etched with a reactive-ion-etching technique using a fluorocarbon based etchant, and the first planarization layer 118 can be etched with a reactive-ion-etching technique using an oxygen based etchant. In the present step, the first photoresist layer 122 can function as a mask during etching of the first ARC layer 120, and can be removed during etching of the first planarization layer 118. In this instance, the first ARC layer 120 can function as a mask during etching of the first planarization layer 118. Further, the second patterning layer 110 can function as an etch-stop layer during etching of the first planarization layer 118.

After transferring the first via bar pattern 124 into the first planarization layer 118 and the first ARC layer 120, the first via bar pattern 124 can be transferred into the second patterning layer 110 exposed by the trench pattern 116. Transferring the first via bar pattern 124 in the present step can be performed by etching the second patterning layer 110 selective to the second hardmask layer 112. A directional etching technique such as a reactive-ion-etching technique can be used to etch the second patterning layer 110. In one embodiment, the second patterning layer 110 can be etched with a reactive-ion-etching technique using a fluorocarbon based etchant. In the present step, the first planarization layer 118 can function as a mask and the first ARC layer 120 can be thinned or removed during etching of the second patterning layer 110. Further, the second hardmask layer 112 can function as an etch-stop layer during the etching of the second patterning layer 110.

Figure 4A:
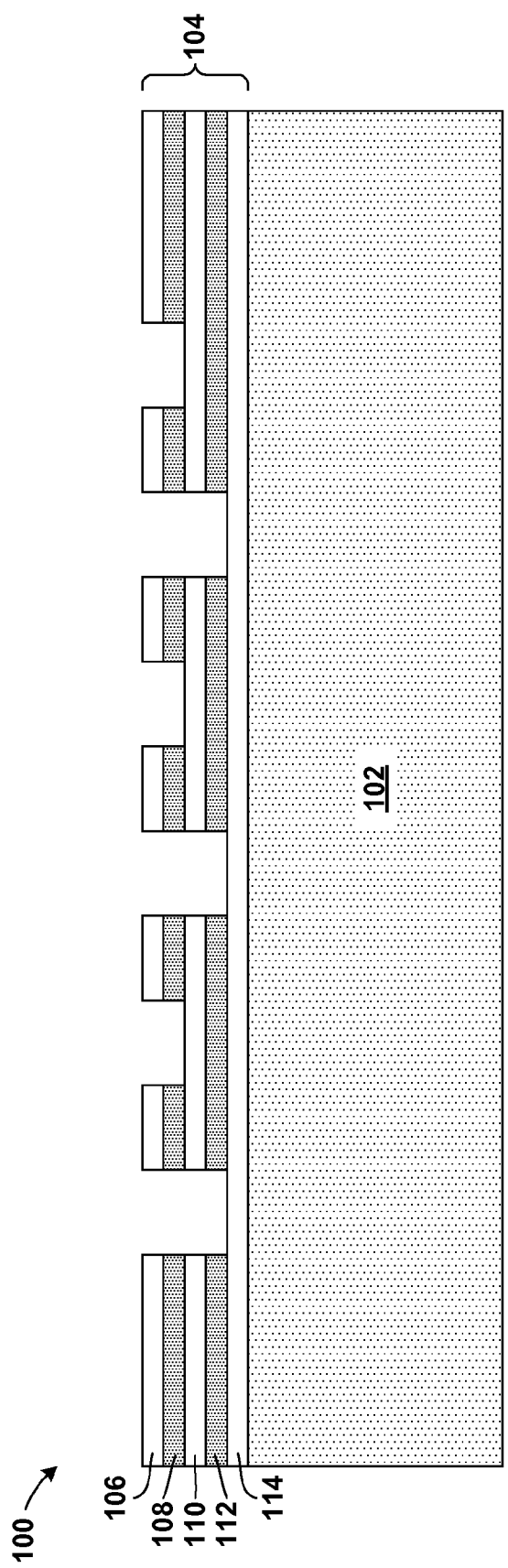
FIG. 4A is a cross section view of FIG. 4, taken along section line A-A.
Figure 4B:
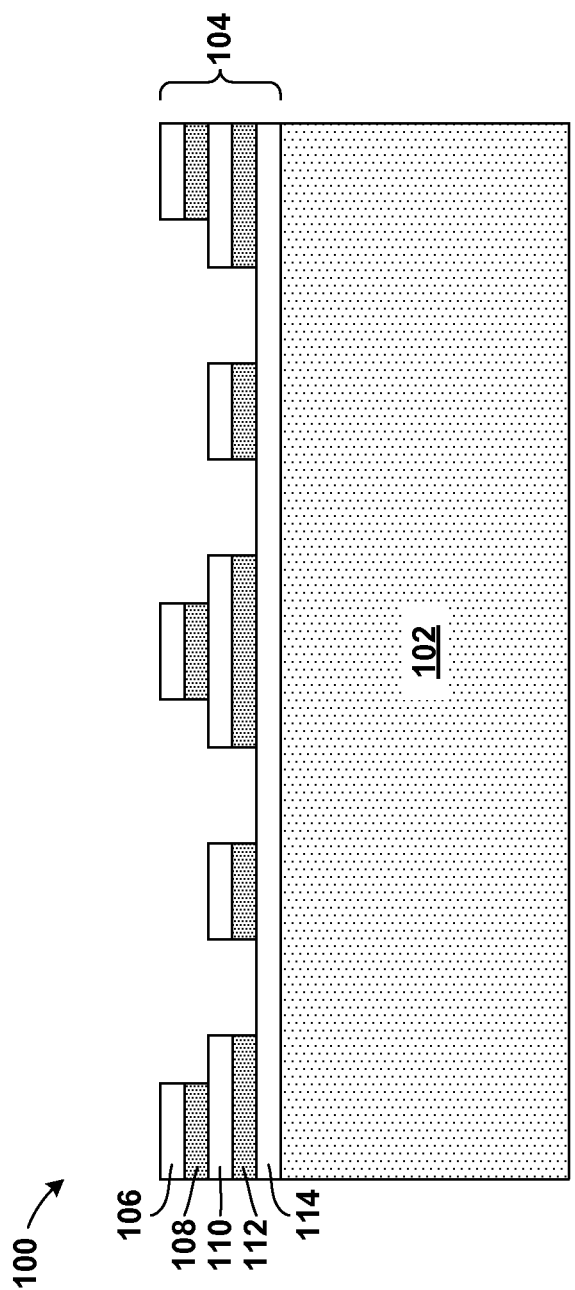
FIG. 4B is a cross section view of FIG. 4, taken along section line B-B.

FIGS. 4, 4A, and 4B are a demonstrative illustration of the structure during an intermediate step of a method of double patterning a self-aligned via (SAV) according to one embodiment. More specifically, the method can include continuation of the first stage of the double patterning technique in which the first via bar pattern 124 can be transferred from the first planarization layer 118 into the second hardmask layer 112 of the a penta-layer hardmask 104. FIG. 4 illustrates the structure 100 from a top view. FIG. 4A is a cross section view of FIG. 4 taken along section line A-A. FIG. 4B is a cross section view of FIG. 4 taken along section line B-B.

Transferring of the first via bar pattern 124 (FIG. 3) in the present step can be performed by etching the second hardmask layer 112 selective to the third patterning layer 114. A directional etching technique such as a reactive-ion-etching technique can be used to etch the second hardmask layer 112. In one embodiment, the second hardmask layer 112 can be etched with a reactive-ion-etching technique using a fluorocarbon gas based breakthrough step first, then followed by chlorine based etchant. In the present step, any remaining portion of the first ARC layer 120 will be removed during the breakthrough step, and the first planarization layer 118 can function as the primary mask for etching of the second hardmask layer 112.

Thereafter, the first planarization layer 118 (FIG. 3) can be removed or lifted off. The first planarization layer 118 (FIG. 3) can be stripped or removed with either a wet clean technique, for example SP clean, or with a plasma etching technique using an oxygen based plasma. It should be noted that only a portion of the via bar pattern 124 (FIG. 3) can be transferred into the second hardmask layer 112. The portion of the via bar pattern 124 (FIG. 3) transferred into the second hardmask layer 112 can be referred to as a self-aligned via (SAV) pattern, where only the overlapping area between the via bar pattern 124 (FIG. 3) and the trench pattern 116 (FIG. 2) will be transferred, and a portion of the via bar pattern 124 (FIG. 3) outside the trench will not be transferred.

Figure 5:
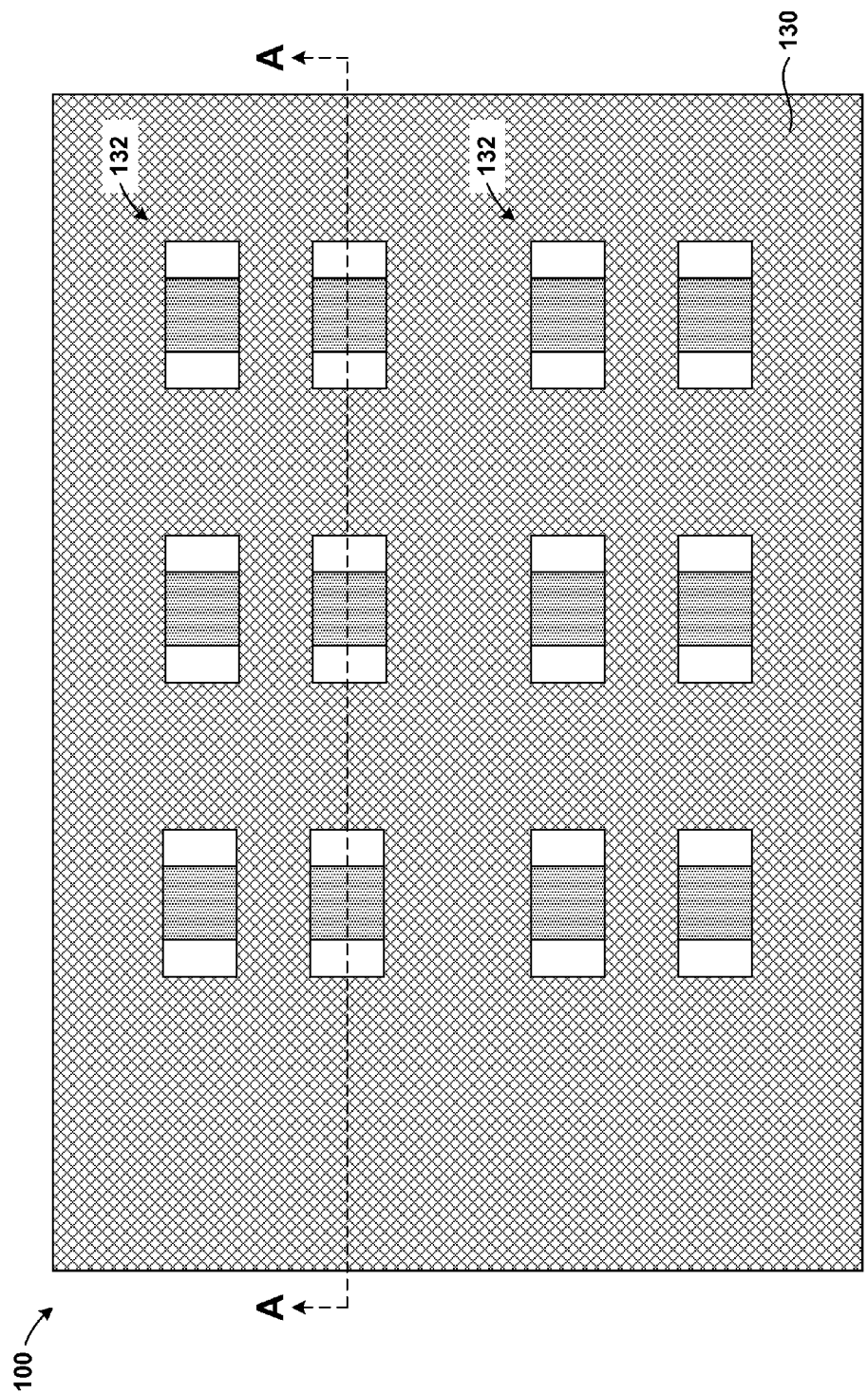
FIG. 5 is a top view of the structure and illustrates forming a second via bar pattern in a second ARC layer, a second planarization layer, and the second pattering layer according to an exemplary embodiment.
Figure 5A:
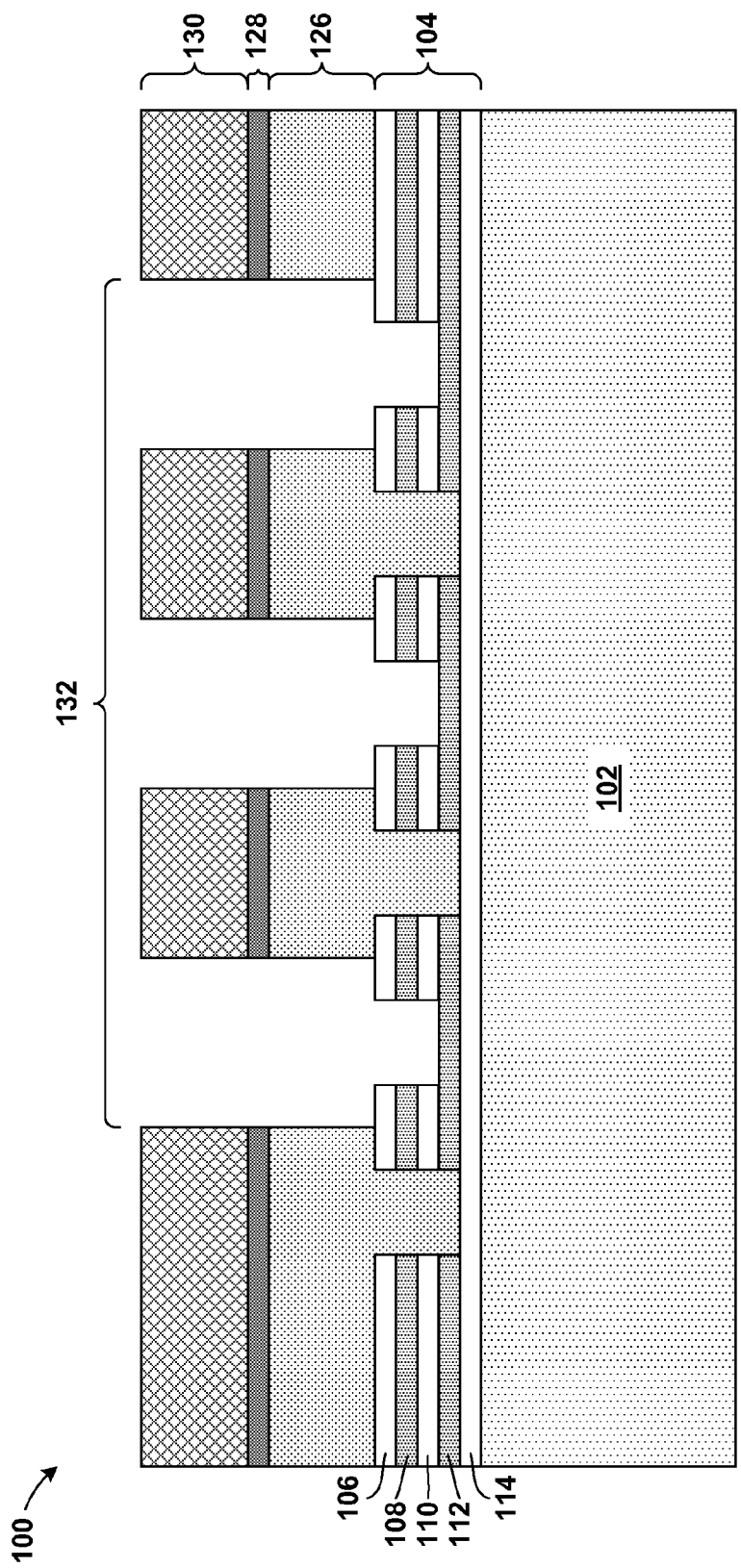
FIG. 5A is a cross section view of FIG. 5, taken along section line A-A.

FIGS. 5 and 5A are a demonstrative illustration of the structure during an intermediate step of a method of double patterning a self-aligned via (SAV) according to one embodiment. More specifically, the method can include a second stage of the double patterning technique in which a second via bar pattern 132 can be transferred into a second planarization layer 126 and a second anti-reflective coating layer 128 (hereinafter "ARC" layer). FIG. 5 illustrates the structure 100 from a top view. FIG. 5A is a cross section view of FIG. 5 taken along section line A-A. It should be noted that the second sage of the double patterning technique described below is substantially similar to the first stage described above; however, the second stage can be applied to an alternate location in accordance with known double patterning techniques.

First, as illustrated in the figures, the second planarization layer 126, the second ARC layer 128, and a second photo-resist layer 130 can be formed on top of one another and in sequence above the structure 100. The second via bar pattern 132 is substantially similar to the first via bar pattern 124 described above. Also, the second planarization layer 126 and the second ARC layer 128 are substantially similar to the first planarization layer 118 and the first ARC layer 120 described above.

During this step, the second photo-resist layer 130 can be formed on top of the second ARC layer 128. The second photo-resist layer 130 is substantially similar to the first photo-resist layer 122 described above. The second photo-resist layer 130 can then be lithographically exposed and developed to create the second via bar pattern 132. Like above, the second via bar pattern 132 can be formed by applying any appropriate photo-exposure method suitable to the type of photo-resist layer being used, as is well known in the art. Also like above, the second via bar pattern 132 can be transferred from the first photo-resist layer 130 into underlying layers, for example, the second ARC layer 128 and the second planarization layer 126. Next, the second via bar pattern 132 can be transferred into the second patterning layer 110, like above.

Figure 6:
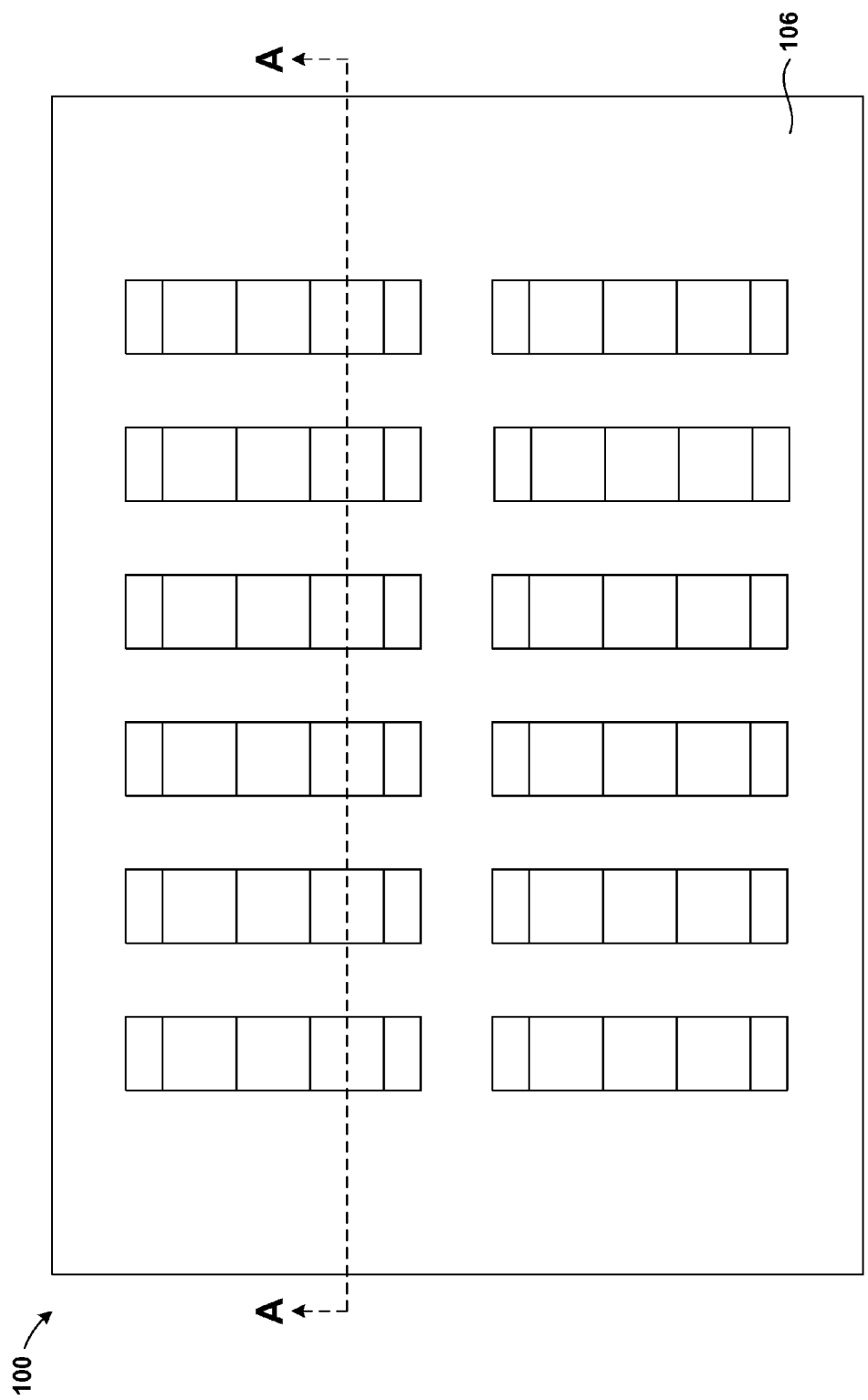
FIG. 6 is a top view of the structure and illustrates forming the second via bar pattern in the second hardmask layer according to an exemplary embodiment.
Figure 6A:
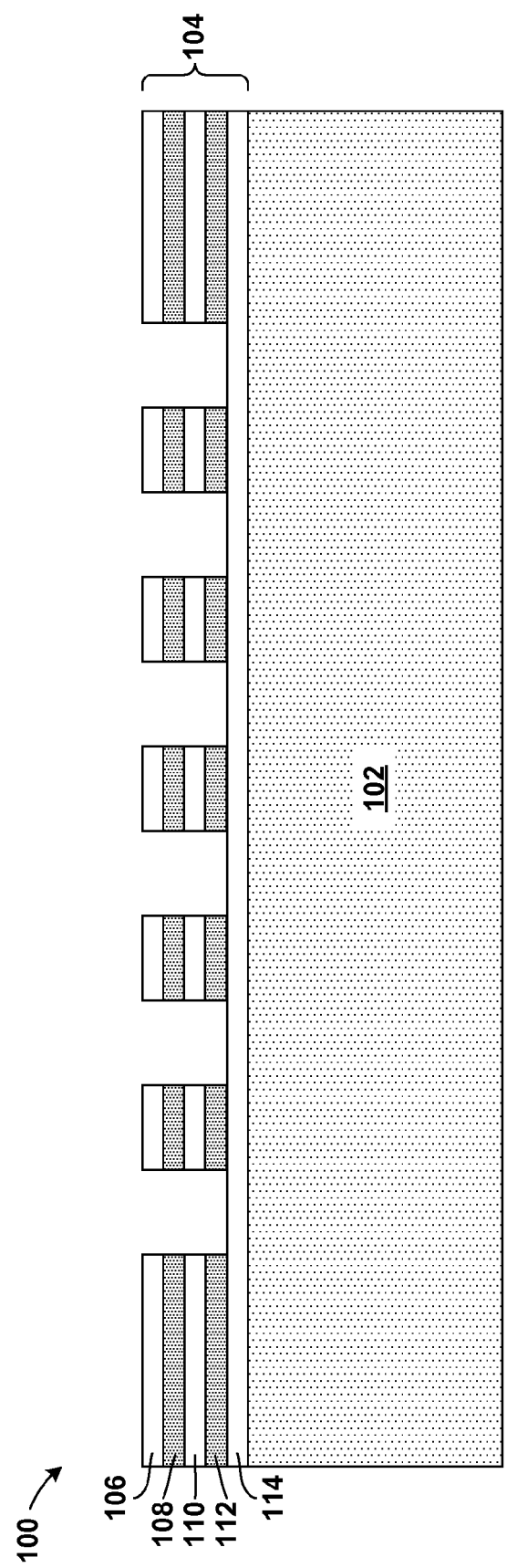
FIG. 6A is a cross section view of FIG. 6, taken along section line A-A.
Figure 7:
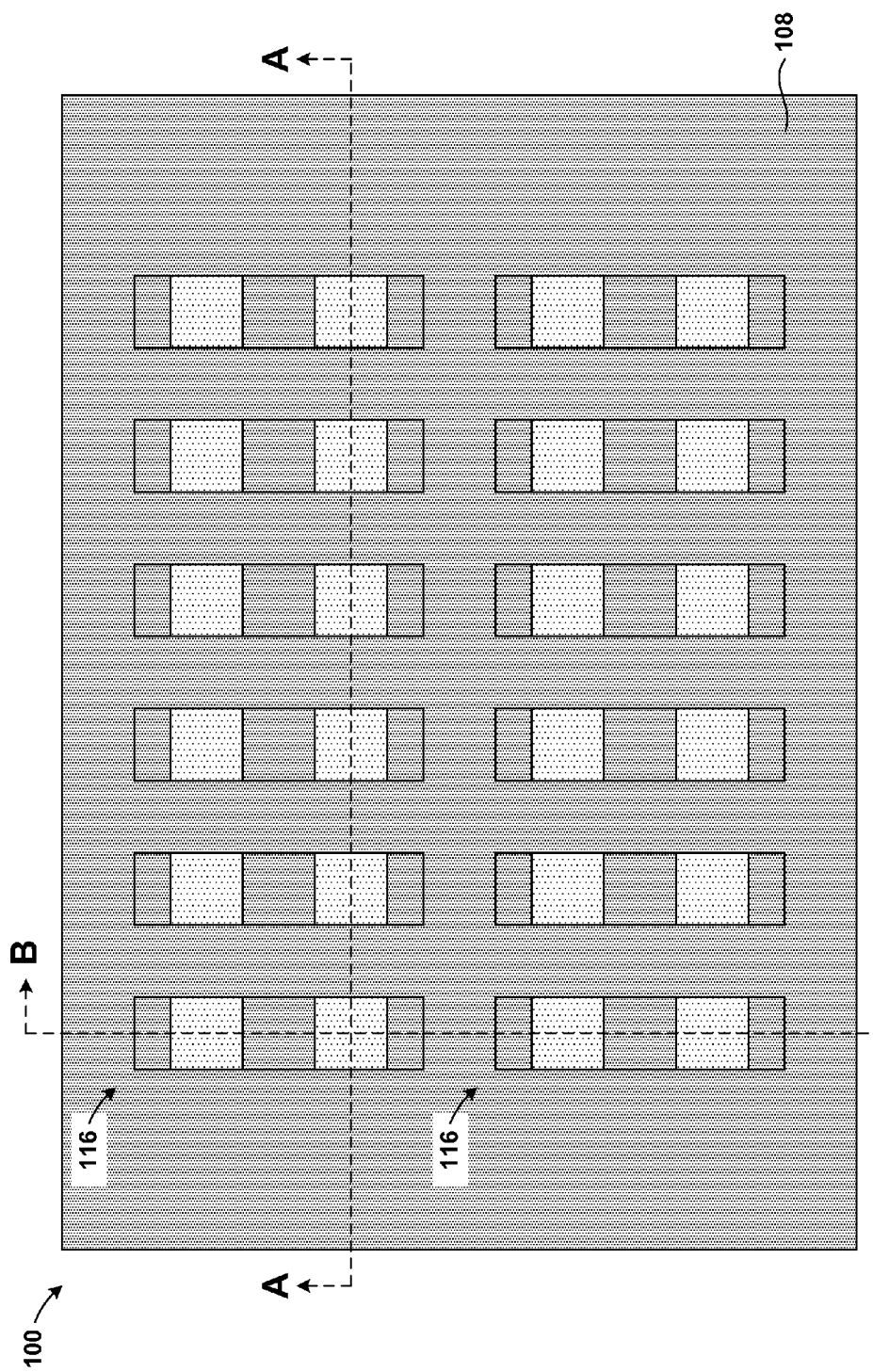
FIG. 7 is a top view of the structure and illustrates transferring a dual self-aligned via pattern from the second hardmask layer to a substrate according to an exemplary embodiment.
Figure 7A:
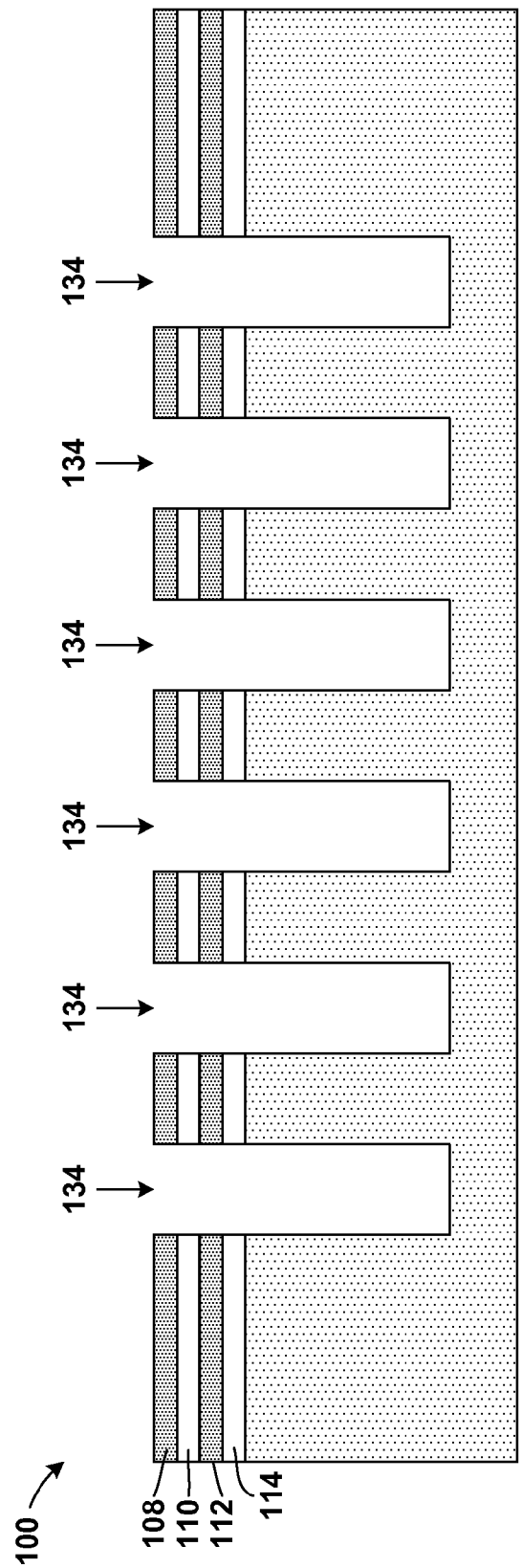
FIG. 7A is a cross section view of FIG. 7, taken along section line A-A.

FIGS. 6 and 6A are a demonstrative illustration of the structure during an intermediate step of a method of double patterning a self-aligned via (SAV) according to one embodiment. More specifically, the method can include continuation of the second stage of the double patterning technique in which the second via bar pattern 132 can be transferred from the second planarization layer 126 into the second hardmask layer 112 of the a penta-layer hardmask 104. FIG. 6 illustrates the structure 100 from a top view. FIG. 6A is a cross section view of FIG. 6 taken along section line A-A. The second via bar pattern 132 can be transferred into the second hardmask layer 112, and the second ARC layer 128 and the second planarization layer 126 can be removed as described above with reference to FIG. 4. Again, it should be noted that only a portion of the via bar pattern 132 (FIG. 5) can be transferred into the second hardmask layer 112. The portion of the via bar pattern 132 (FIG. 5) transferred into the second hardmask layer 112 can be referred to as the self-aligned via (SAV) pattern, as described above FIGS. 7, 7A, and 7B are a demonstrative illustration of the structure during an intermediate step of a method of double patterning a self-aligned via (SAV) according to one embodiment. More specifically, the method can include etching the SAV pattern into the underlying substrate, the SAV pattern being defined by the second hardmask layer 112. Again, the SAV pattern can refer to the portions of the first and second via bar patterns 124, 132 transferred into the second hardmask layer 112, as described above with reference to FIGS. 3-6. FIG. 7 illustrates the structure 100 from a top view. FIG. 7A is a cross section view of FIG. 7 taken along section line A-A. FIG. 7B is a cross section view of FIG. 7 taken along section line B-B.

Transferring the SAV pattern in the present step can be performed by etching the third patterning layer 114 and the substrate 102 to a desired depth. The desired depth can depend on the ultimate function of the structure 100. A directional etching technique such as a reactive-ion-etching technique can be used to etch the third patterning layer 114 and the substrate 102. In one embodiment, the third patterning layer 114 and the substrate 102 can be etched with a reactive-ion-etching technique using a fluorocarbon based etchant. In the present step, the second hardmask layer 112 can function as a mask, and can have a high etch-selectivity relative to the third patterning layer 114 and the substrate 102. Furthermore, the first patterning layer 106 (FIG. 6) can be simultaneously removed from above the first hardmask layer 108 during etching of the SAV pattern.

Figure 8:
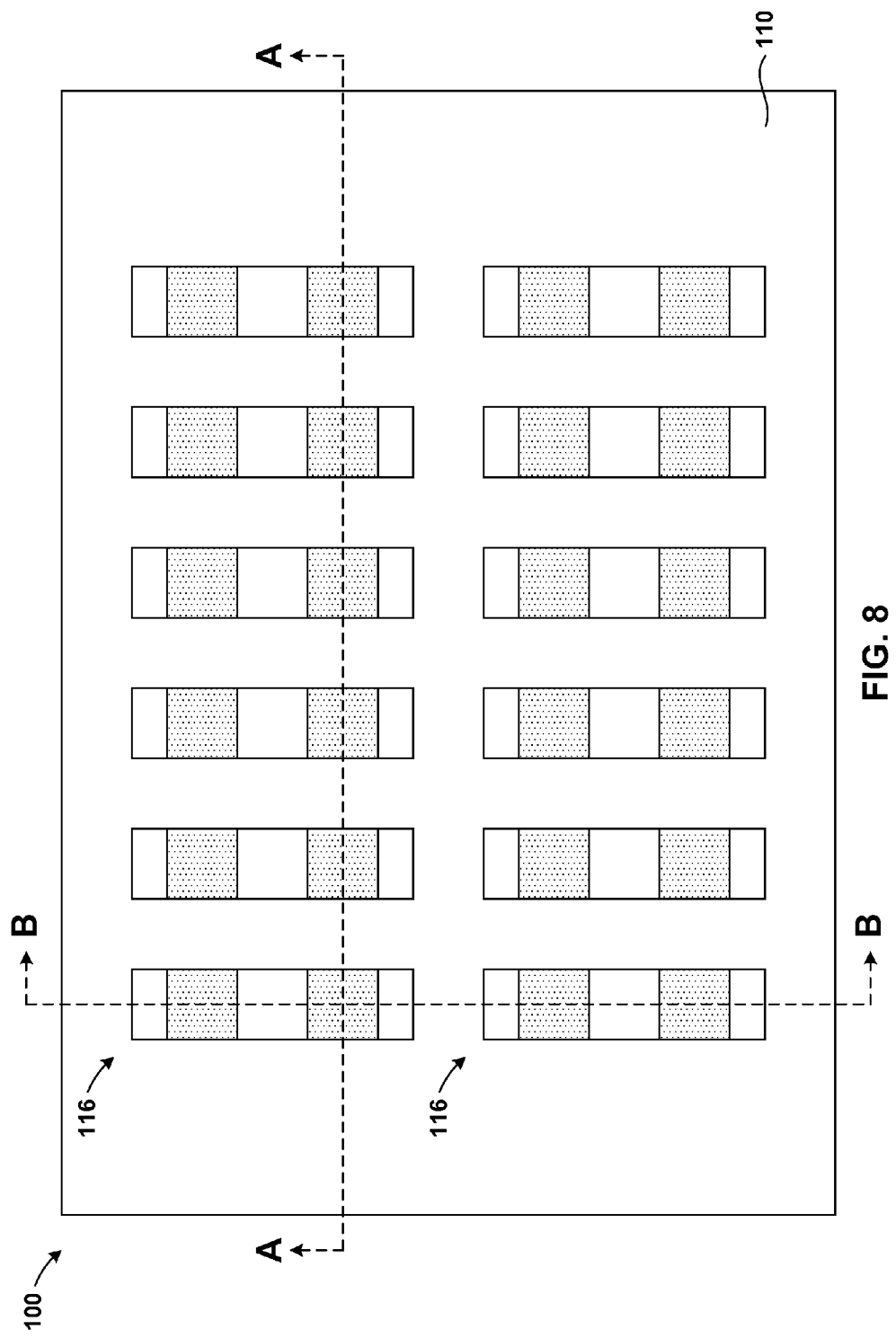
FIG. 8 is a top view of the structure and illustrates transferring the trench pattern from the first hardmask layer to the second hardmask layer.
Figure 8A:
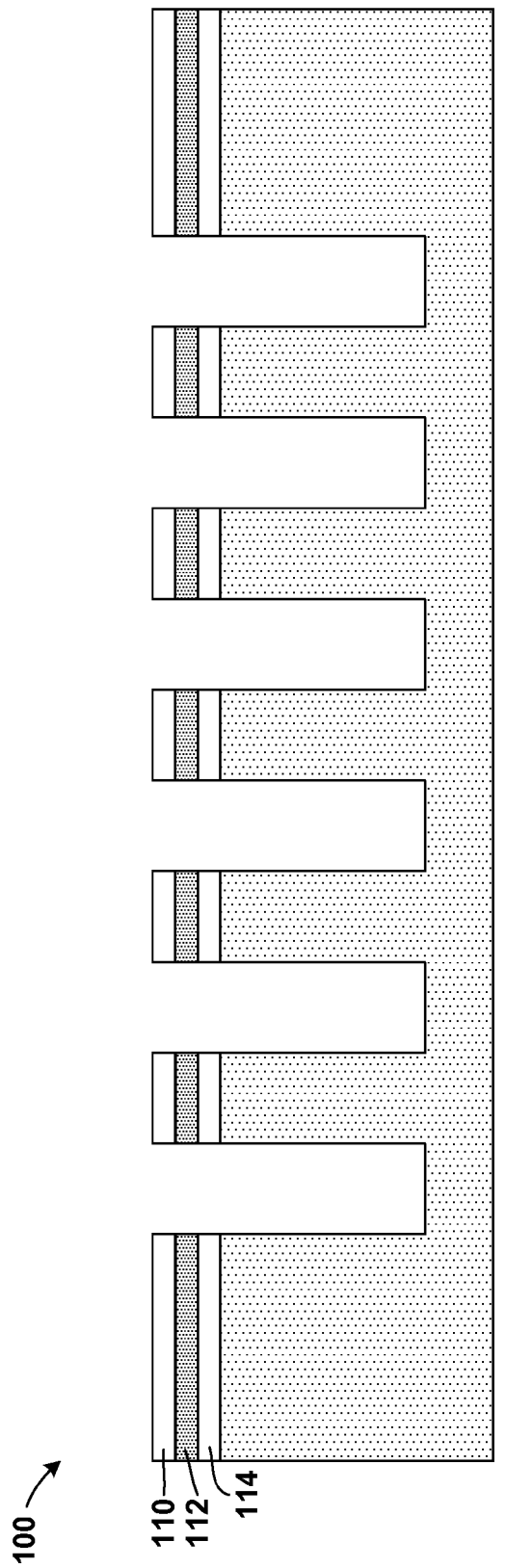
FIG. 8A is a cross section view of FIG. 8, taken along section line A-A.

FIGS. 8, 8A, and 8B are a demonstrative illustration of the structure during an intermediate step of a method of double patterning a self-aligned via (SAV) according to one embodiment. More specifically, the method can include transferring the trench pattern 116 from the first hardmask layer 108 to the second hardmask layer 112. FIG. 8 illustrates the structure 100 from a top view. FIG. 8A is a cross section view of FIG. 8 taken along section line A-A. FIG. 8B is a cross section view of FIG. 8 taken along section line B-B.

Transferring the trench pattern 116 of the first hardmask layer 108 in the present step can be performed by etching the second hardmask layer 112 selective to the second and third patterning layers 110, 114. A directional etching technique such as a reactive-ion-etching technique can be used to etch the second hardmask layer 112. In one embodiment, the second hardmask layer 112 can be etched with a reactive-ion-etching technique using a fluorocarbon plasma breakthrough step, followed by a chlorine based etchant. In the present step, the second patterning layer 110 can function as a mask, and the third patterning layer 114 can function as an etch-stop layer during the etching of the second hardmask 112. Furthermore, the first hardmask layer 108 (FIG. 7) can be simultaneously removed during transferring the trench pattern 116 into the second hardmask layer 112.

Figure 9:
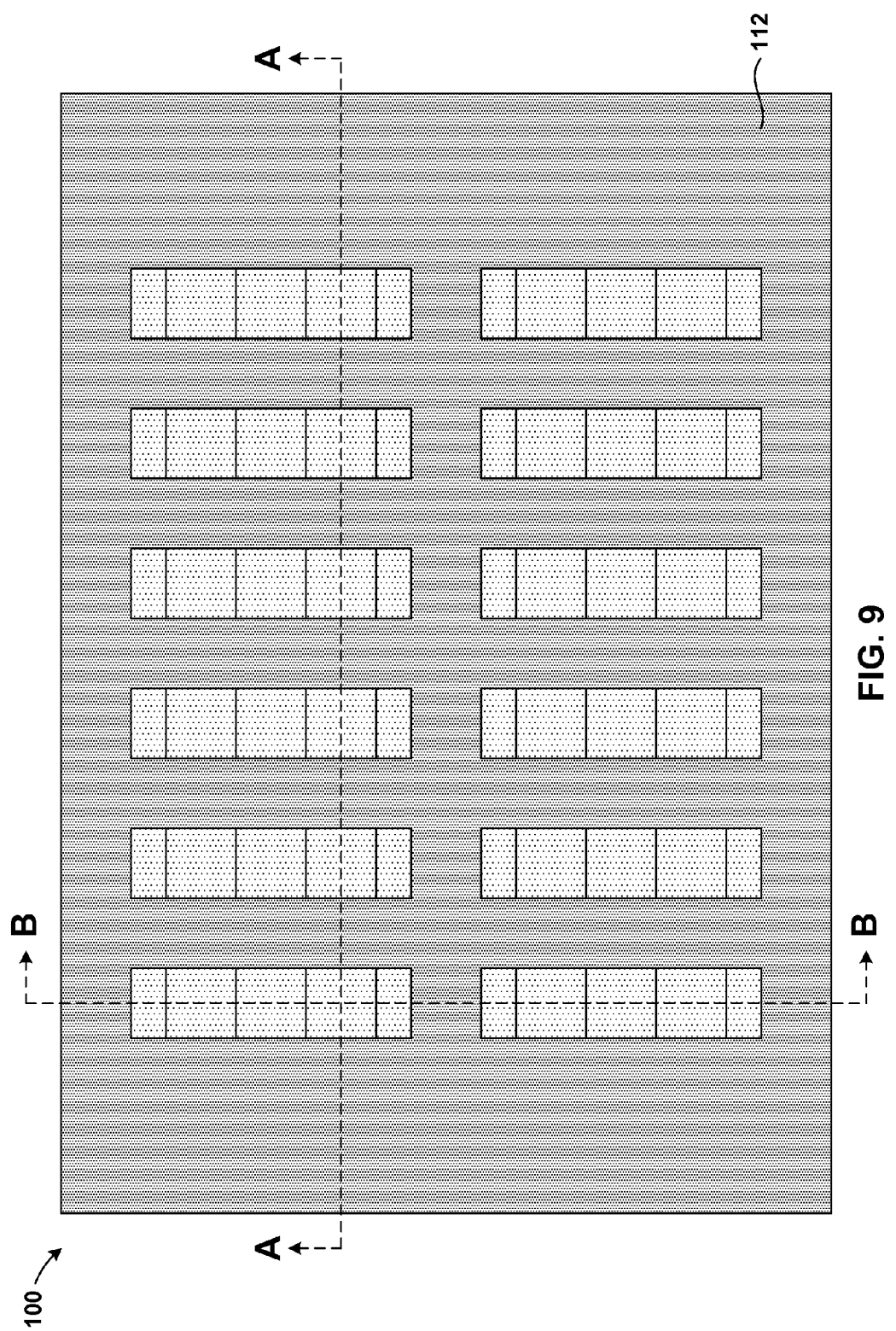
FIG. 9 is a top view of the structure and illustrates transferring the damascene pattern from the second hardmask layer to the substrate according to an exemplary embodiment.
Figure 9A:
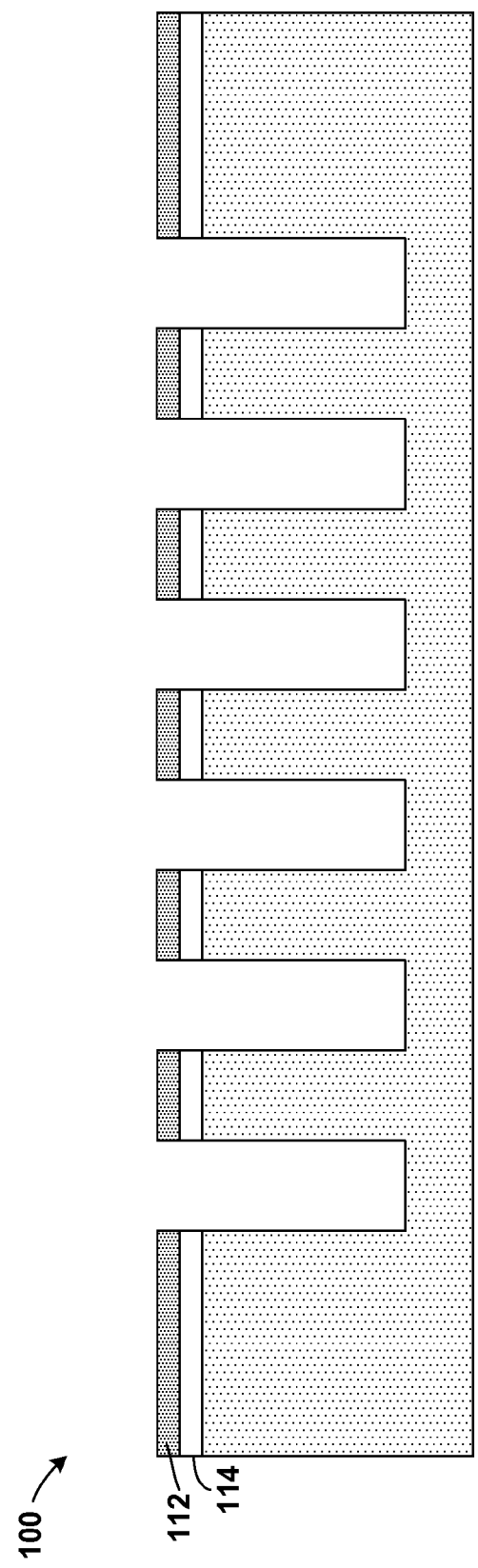
FIG. 9A is a cross section view of FIG. 9, taken along section line A-A.
Figure 9B:
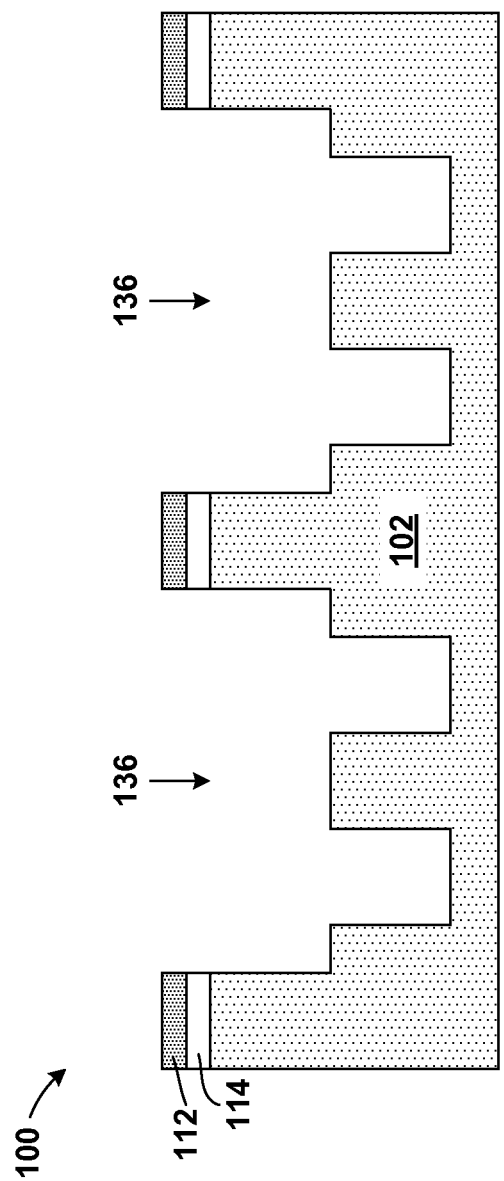
FIG. 9B is a cross section view of FIG. 9, taken along section line B-B.

FIGS. 9, 9A, and 9B are a demonstrative illustration of the structure during an intermediate step of a method of double patterning a self-aligned via (SAV) according to one embodiment. More specifically, the method can include etching the trench pattern 116 now defined by the second hardmask layer 112 into the underlying substrate 102. FIG. 9 illustrates the structure 100 from a top view. FIG. 9A is a cross section view of FIG. 9 taken along section line A-A. FIG. 9B is a cross section view of FIG. 9 taken along section line B-B.

Transferring the trench pattern 116 in the present step can be performed by etching the third patterning layer 114 and the substrate 102 to a desired depth. The desired depth can depend on the ultimate function of the structure 100. A directional etching technique such as a reactive-ion-etching technique can be used to etch the third patterning layer 114 and the substrate 102. In one embodiment, the third patterning layer 114 and the substrate 102 can be etched with a reactive-ion-etching technique using a fluorocarbon based etchant. In the present step, the second hardmask layer 112 can function as a mask, and can have a high etch-selectivity relative to the third patterning layer 114 and the substrate 102. Furthermore, the second patterning layer 110 (FIG. 8) can be simultaneously removed from above the second hardmask layer 112 during etching of the via pattern.

Figure 10:
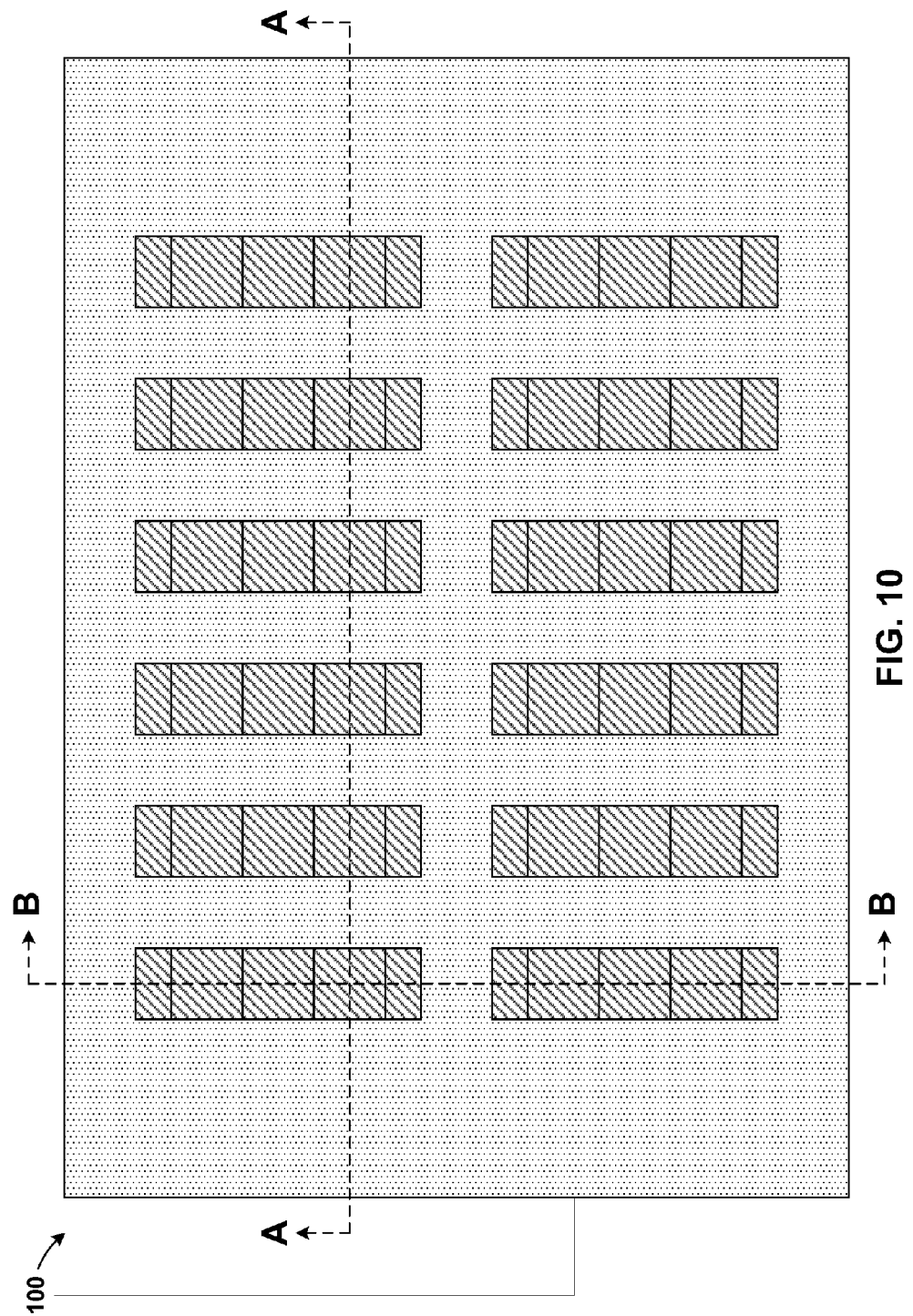
FIG. 10 is a top view of the structure and illustrates forming the final structure according to an exemplary embodiment.
Figure 10A:
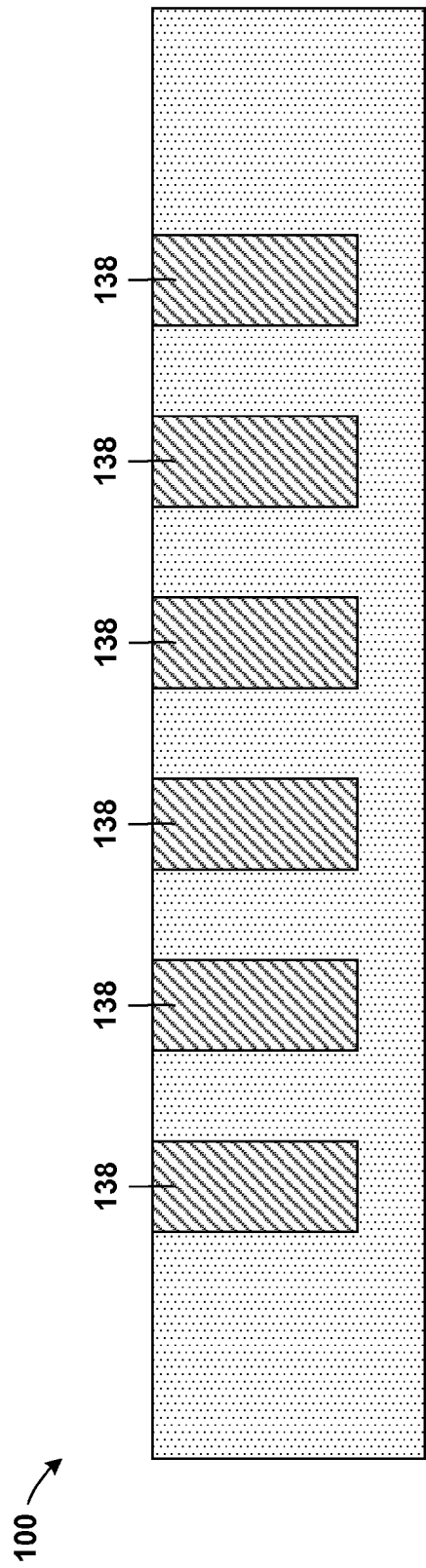
FIG. 10A is a cross section view of FIG. 10, taken along section line A-A.
Figure 10B:
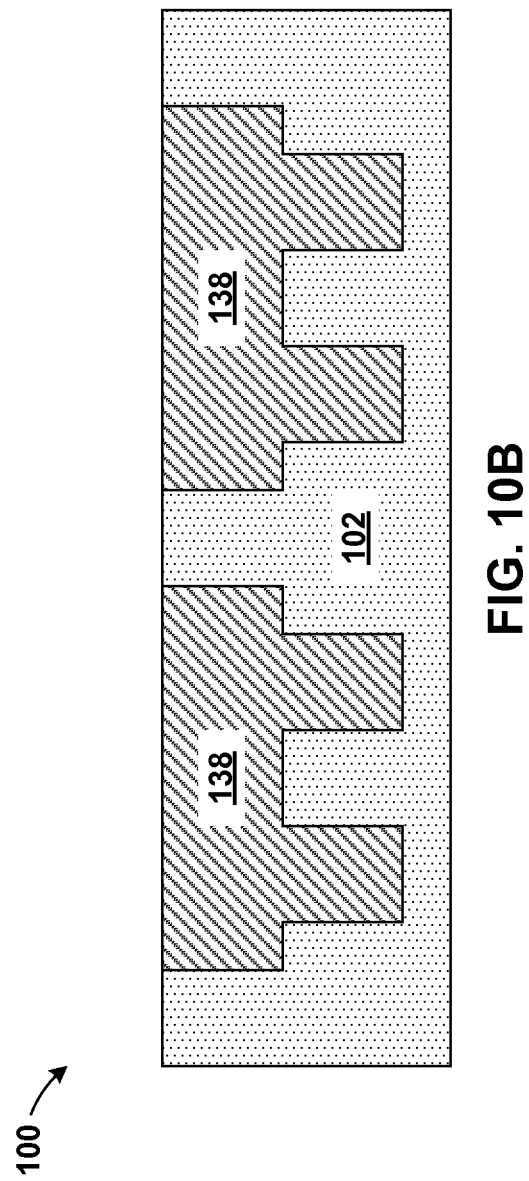
FIG. 10B is a cross section view of FIG. 10, taken along section line B-B.

FIGS. 10, 10A, and 10B are a demonstrative illustration of a final of a method of double patterning a self-aligned via (SAV) according to one embodiment. More specifically, the final structure can include an interconnect structure 134 formed by filling the SAV pattern and the trench pattern 116 with a conductive interconnect material. FIG. 10 illustrates the structure 100 from a top view. FIG. 10A is a cross section view of FIG. 10 taken along section line A-A. FIG. 10B is a cross section view of FIG. 10 taken along section line B-B. In one embodiment, typical processing techniques known in the art can be used to fill the SAV pattern and the trench pattern 116 with a conductive interconnect material to form the interconnect structure 134.

The above described double patterning a self-aligned via (SAV) technique can have distinct advantages over other comparable techniques. The process window of the traditional patterning of self-aligned via bars may restricted by limited control of critical dimensions, high aspect ratios, and mask corner rounding issues uncorrectable by optical proximity correction. Furthermore, typical double patterning techniques require at least two hardmask layers, two ARC layers, and two planarization layers all stacked on top of one another. The additional stack height yields poor uniformity in the resulting via.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed:

1. A method comprising:
   forming a penta-layer hardmask above a substrate, the penta-layer hardmask comprising a first hardmask layer above a second hardmask layer;
   forming a trench pattern in the first hardmask layer;
   transferring a first via bar pattern from a first photo-resist layer above the penta-layer hardmask into the second hardmask layer resulting in a first via pattern, the first via pattern in the second hardmask layer overlapping the trench pattern and being self-aligned on two sides by the trench pattern in the first hardmask layer,
   wherein the transferring the first via bar pattern from the first photo-resist layer includes forming a first anti reflective coating (ARC) layer above a first planarization layer above the penta-layer hardmask and forming the first via bar pattern in the first photo-resist layer on top of the first ARC layer; and
   transferring the first via pattern from the second hardmask layer into the substrate resulting in a self-aligned via opening, the self-aligned via opening being self-aligned on all sides by the first via pattern in the second hardmask layer.

2. The method of claim 1, further comprising:
   transferring a second via bar pattern from a second photo-resist layer above the penta-layer hardmask into the second hardmask layer resulting in a second via pattern, the second via pattern in the second hardmask layer overlapping the trench pattern and being self-aligned on two sides by the trench pattern in the first hardmask layer; and
   transferring the second via pattern, simultaneously with the first via pattern, from the second hardmask layer into the substrate resulting in a self-aligned via opening, the self-aligned via opening being self-aligned on all sides by the self-aligned via pattern in the second hardmask layer.

3. The method of claim 2, wherein transferring the second via bar pattern from the second photo-resist layer above the penta-layer hardmask into the second hardmask layer resulting in the second via pattern comprises:
   depositing a second anti-reflective coating (ARC) layer above a second planarization layer above the penta-layer hardmask;
   forming the second via bar pattern in the second photo-resist material on top of the ARC layer;
   transferring the second via bar pattern from the second photo-resist layer into the second ARC layer and the second planarization layer;
   transferring the second via bar pattern from the second ARC layer and the second planarization layer into the second hardmask; and
   removing the second block ARC layer and the second block planarization layer.

4. The method of claim 1, wherein transferring the first via bar pattern from the first photo-resist layer above the penta-layer hardmask into the second hardmask layer resulting in the first via pattern comprises:
   transferring the first via bar pattern from the first photo-resist layer into the first ARC layer and the first planarization layer;
   transferring the first via bar pattern from the first ARC layer and the first planarization layer into the second hardmask; and removing the first block ARC layer and the first block planarization layer.

5. The method of claim 1, further comprising:
transferring the trench pattern into the substrate.

6. The method of claim 5, wherein transferring the trench pattern into the substrate comprises:
transferring the trench pattern from the first hardmask layer into the second hardmask layer; and
transferring the trench pattern from the second hardmask layer into the substrate.

7. The method of claim 1, wherein forming the penta-layer hardmask above the substrate comprises:
depositing a third patterning layer above the substrate;
depositing the second hardmask layer above the first patterning layer;
depositing a second patterning layer above the second hardmask layer;
depositing the first hardmask layer above the second patterning layer; and
depositing a first patterning layer above the first hardmask layer.

8. A method comprising:
forming a penta-layer hardmask above a substrate, the penta-layer hardmask comprising a first hardmask layer above a second hardmask layer;
forming a trench pattern in the first hardmask layer;
transferring a first via bar pattern from a first photo-resist layer above the penta-layer hardmask into the second hardmask layer resulting in a first via pattern, the first via pattern in the second hardmask layer overlapping the trench pattern and being self-aligned on two sides by the trench pattern in the first hardmask layer;
transferring a second via bar pattern from a second photo-resist layer above the penta-layer hardmask into the second hardmask layer resulting in a second via pattern, the second via pattern in the second hardmask layer overlapping the trench pattern and being self-aligned on two sides by the trench pattern in the first hardmask layer; and
transferring the first via pattern from the second hardmask layer into the substrate resulting in a self-aligned via opening, the self-aligned via opening being self-aligned on all sides by the first via pattern in the second hardmask layer.

9. The method of claim 1, further comprising:
transferring the second via pattern, simultaneously with the first via pattern, from the second hardmask layer into the substrate resulting in a self-aligned via opening, the self-aligned via opening being self-aligned on all sides by the self-aligned via pattern in the second hardmask layer.

10. The method of claim 8, wherein transferring the second via bar pattern from the second photo-resist layer above the penta-layer hardmask into the second hardmask layer resulting in the second via pattern comprises:
depositing a second anti-reflective coating (ARC) layer above a second planarization layer above the penta-layer hardmask;
forming the second via bar pattern in the second photo-resist material on top of the ARC layer;
transferring the second via bar pattern from the second photo-resist layer into the second ARC layer and the second planarization layer;
transferring the second via bar pattern from the second ARC layer and the second planarization layer into the second hardmask layer; and
removing the second block ARC layer and the second block planarization layer.

11. The method of claim 8, wherein transferring the first via bar pattern from the first photo-resist layer above the penta-layer hardmask into the second hardmask layer resulting in the first via pattern comprises:
depositing a first anti-reflective coating (ARC) layer above a first planarization layer above the penta-layer hardmask;
forming the first via bar pattern in the first photo-resist material on top of the first ARC layer;
transferring the first via bar pattern from the first photo-resist layer into the first ARC layer and the first planarization layer;
transferring the first via bar pattern from the first ARC layer and the first planarization layer into the second hardmask; and
removing the first block ARC layer and the first block planarization layer.

12. The method of claim 1, further comprising:
transferring the trench pattern into the substrate.

13. The method of claim 12, wherein transferring the trench pattern into the substrate comprises:
transferring the trench pattern from the first hardmask layer into the second hardmask layer; and
transferring the trench pattern from the second hardmask layer into the substrate.

14. The method of claim 8, wherein forming the penta-layer hardmask above the substrate comprises:
depositing a third patterning layer above the substrate;
depositing the second hardmask layer above the first patterning layer;
depositing a second patterning layer above the second hardmask layer;
depositing the first hardmask layer above the second patterning layer; and
depositing a first patterning layer above the first hardmask layer.

* * * * *